US012720953B2

(12) United States Patent
Hyun et al.

(10) Patent No.: US 12,720,953 B2
(45) Date of Patent: Aug. 25, 2026

(54) DISPLAY DEVICE

(71) Applicant: SAMSUNG DISPLAY CO., LTD., Yongin-si (KR)

(72) Inventors: Jin Ho Hyun, Gwacheon-si (KR); Hee Chang Yoon, Anyang-si (KR); Hyoung Sub Lee, Yongin-si (KR); Hye Min Lee, Gimpo-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 771 days.

(21) Appl. No.: 18/056,529

(22) Filed: Nov. 17, 2022

(65) Prior Publication Data

US 2023/0255050 A1 Aug. 10, 2023

(30) Foreign Application Priority Data

Feb. 9, 2022 (KR) ........................ 10-2022.0016727

(51) Int. Cl.
*H10K 50/844* (2023.01)
*G06F 3/044* (2006.01)
(Continued)

(52) U.S. Cl.
CPC ......... *H10K 50/844* (2023.02); *G06F 3/0446* (2019.05); *H10K 59/122* (2023.02);
(Continued)

(58) Field of Classification Search
CPC .. H10K 50/844; H10K 59/122; H10K 59/352; H10K 59/353; H10K 59/40;
(Continued)

(56) References Cited

U.S. PATENT DOCUMENTS 10,541,380 B1 * 1/2020 Sung .................... H10K 50/844
2017/0237038 A1 * 8/2017 Kim ....................... H10K 77/10
257/40

(Continued)

FOREIGN PATENT DOCUMENTS

| | | |
|---|---|---|
| CN | 112420896 | 2/2021 |
| EP | 3 618 120 | 3/2020 |
| KR | 10-2022-0041261 | 4/2022 |

*Primary Examiner* — Jessica S Manno
*Assistant Examiner* — Bipana Adhikari Dawadi
(74) *Attorney, Agent, or Firm* — F. CHAU & ASSOCIATES, LLC

(57) ABSTRACT

A display device includes a substrate including a front portion, a first side portion extending from the front portion along a first direction, a second side portion extending from the front portion along a second direction, and a corner portion between the first and second side portions and that includes a cut-out pattern; a first light emitting element on the front portion of the substrate; a second light emitting element on the cut-out pattern of the substrate; a first dam between the front portion and the corner portion; a second dam on the cut-out pattern, the second dam that surrounds the second light emitting element; an encapsulation layer on the substrate and that covers the first light emitting element, the second light emitting element, the first dam, and the second dam; and an organic passivation layer in a gap space between the first dam and the second dam.

24 Claims, 14 Drawing Sheets

(51) Int. Cl.
*H10K 59/122* (2023.01)
*H10K 59/35* (2023.01)
*H10K 59/40* (2023.01)

(52) U.S. Cl.
CPC ......... *H10K 59/352* (2023.02); *H10K 59/353* (2023.02); *H10K 59/40* (2023.02)

(58) Field of Classification Search
CPC .... H10K 59/873; H10K 50/80; H10K 77/111; H10K 2102/311; H10K 59/8731; G06F 3/0446; H10H 20/85; H10H 29/142; H10H 20/854
See application file for complete search history.

(56) References Cited

U.S. PATENT DOCUMENTS

2018/0159076 A1* 6/2018 Yun .................. H10K 59/80515
2018/0183015 A1* 6/2018 Yun ........................ H10K 71/00
2020/0020883 A1* 1/2020 Chang .................... H10K 77/10
2020/0167037 A1* 5/2020 Lee ...................... H10K 59/873
2020/0176696 A1* 6/2020 Dai ...................... H10K 59/131
2020/0313102 A1* 10/2020 Kim ................... H10K 59/8723
2021/0384465 A1 12/2021 Park et al.
2022/0005877 A1 1/2022 Seo et al.

* cited by examiner

10a
DA2
DA3
CG
CP
DAM2
SDAM1' SDAM3'
SDAM2' SDAM4'
EA3'
271 272 273
193
192
191
OLa
DAM1
SDAM1 SDAM3
SDAM2 SDAM4
EA3"
371 372
TL
TINS3
TINS2
TINS1
SEN
193
192
191
TFELa
373
180
161
160
150
142
141
130
BF1
SUB
TFTL
ANDE2
CE22 CE21
ANDE3
CE32 CE31
X5
FEa
D2
G2
ACT2
S2
ST2
GP
FEb
SD
SG
SACT
SS
SDT
D3
G3
ACT3
S3
ST3
X5'
DR3
270: 271, 272, 273
370: 371, 372, 373
PX2: 270, ST2
PX3: 370, ST3
EML: 270, 370, 180
DISLa: TFTL, EML, TFELa
CAP2: CE21, CE22
CAP3: CE31, CE32

DISPLAY DEVICE

CROSS-REFERENCE TO RELATED APPLICATION

This application claims priority under 35 U.S.C. 119 from Korean Patent Application No. 10-2022-0016727, filed on Feb. 9, 2022 in the Korean Intellectual Property Office, the contents of which are herein incorporated by reference in their entirety.

TECHNICAL FIELD

Embodiments of the present disclosure are directed to a display device.

DISCUSSION OF THE RELATED ART

The demand for a display device that displays images has increased with various forms. For example, display devices have been incorporated into various electronic devices such as smart phones, digital cameras, laptop computers, navigators and smart televisions.

A display device may be, for example, a liquid crystal display device, a field emission display device or a light emitting display device that includes a light emitting element.

As display devices are incorporated into various electronic devices, display devices have various designs, and a display device with an enlarged a display area that extends from flat portions to portions other than a flat portion is desired.

SUMMARY

Embodiments of the present disclosure provide a display device with an enlarged display area.

Embodiments of the present disclosure provide a display device with increased reliability.

An embodiment of a display device includes a substrate that includes a front portion, a first side portion that extends from the front portion along a first direction, a second side portion that extends from the front portion along a second direction that crosses the first direction, and a corner portion disposed between the first side portion and the second side portion and that includes a cut-out pattern; a first light emitting element disposed on the front portion of the substrate and in a first display area in the front portion; a second light emitting element disposed on the cut-out pattern of the substrate and in a second display area in the corner portion; a first dam disposed between the front portion of the substrate and the corner portion of the substrate; a second dam disposed on the cut-out pattern of the substrate and in the second display area, where the second dam surrounds the second light emitting element; an encapsulation layer disposed on the substrate, where the encapsulation layer covers the first light emitting element, the second light emitting element, the first dam, and the second dam; and an organic passivation layer disposed in a gap space between the first dam and the second dam and on the encapsulation layer.

An embodiment of a display device includes a substrate that includes a front portion, a first side portion that extends from the front portion along a first direction, a second side portion that extends from the front portion along a second direction that crosses the first direction, and a corner portion disposed between the first side portion and the second side portion and that includes a cut-out pattern; a first light emitting element disposed on the front portion of the substrate and in a first display area in the front portion; a second light emitting element on the cut-out pattern of the substrate and in a second display area in the corner portion; a first dam disposed between the front portion of the substrate and the corner portion of the substrate; a second dam disposed on the cut-out pattern of the substrate and in the second display area, where the second dam surrounds the second light emitting element; a first inorganic encapsulation layer disposed on the substrate, where the first inorganic encapsulation layer covers the first light emitting element, the second light emitting element, the first dam and the second dam; a second inorganic encapsulation layer disposed on the first inorganic encapsulation layer, and a first organic passivation layer disposed between the first inorganic encapsulation layer and the second inorganic encapsulation layer and in a gap space between the first dam and the second dam.

An embodiment of a display device includes a substrate that includes a front portion, a first side portion that extends from the front portion along a first direction, a second side portion that extends from the front portion along a second direction that crosses the first direction, and a corner portion disposed between the first side portion and the second side portion and that includes a cut-out pattern, where the substrate further includes a first display area in the front portion, a second display area in the cutout pattern, and a third display area disposed between the first display area and the second display area; a first light emitting element disposed in the first display area; a second light emitting element disposed in the second display area; a third light emitting element disposed in the third display area; a first dam disposed between the front portion of the substrate and the corner portion of the substrate; a second dam disposed on the cut-out pattern of the substrate and in the second display area, wherein the second dam surrounds the second light emitting element; and a first organic passivation layer disposed in a gap space between the first dam and the second dam.

DETAILED DESCRIPTION

Embodiments of the present disclosure will now be described more fully hereinafter with reference to the accompanying drawings. Embodiments of the disclosure may take different forms and should not be construed as limited to embodiments set forth herein. The same reference numbers may indicate the same components throughout the specification.

Hereinafter, embodiments of the present disclosure will be described with reference to the accompanying drawings.

Figure 1:
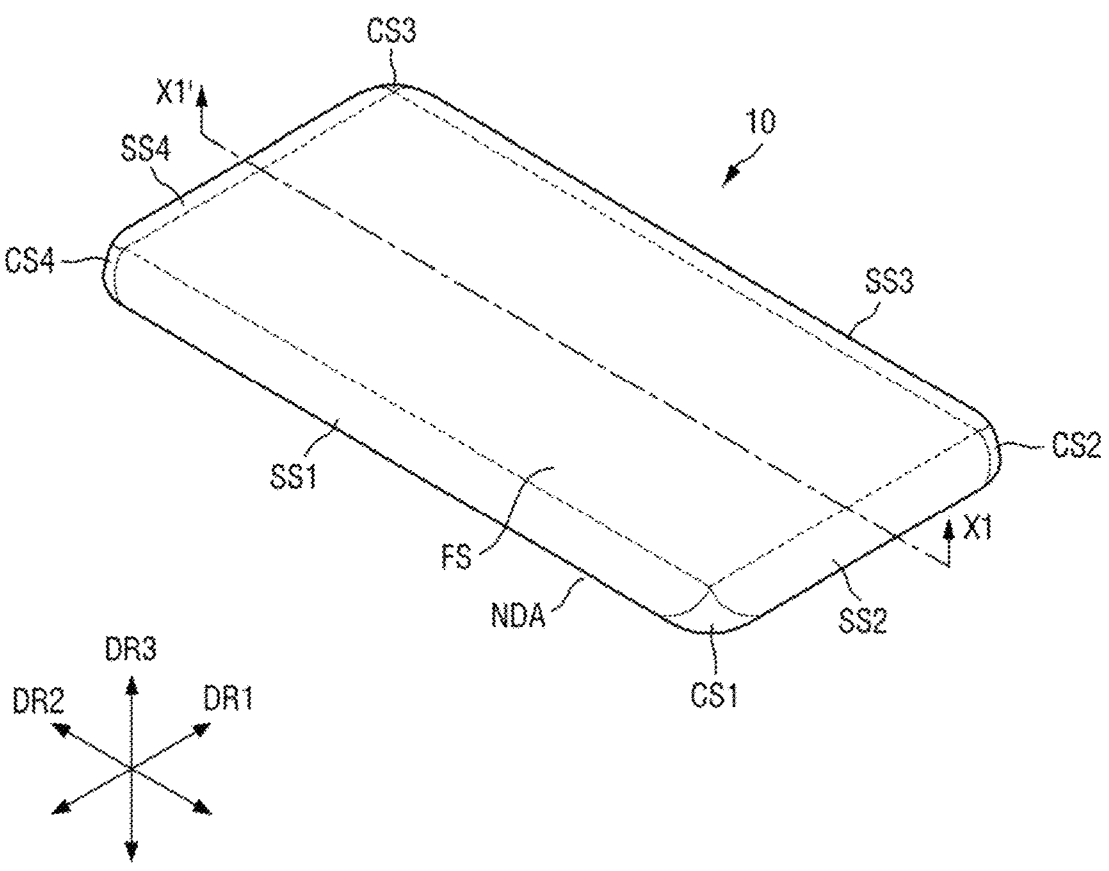
FIG. 1 is a perspective view of a display device according to an embodiment.
Figure 2:
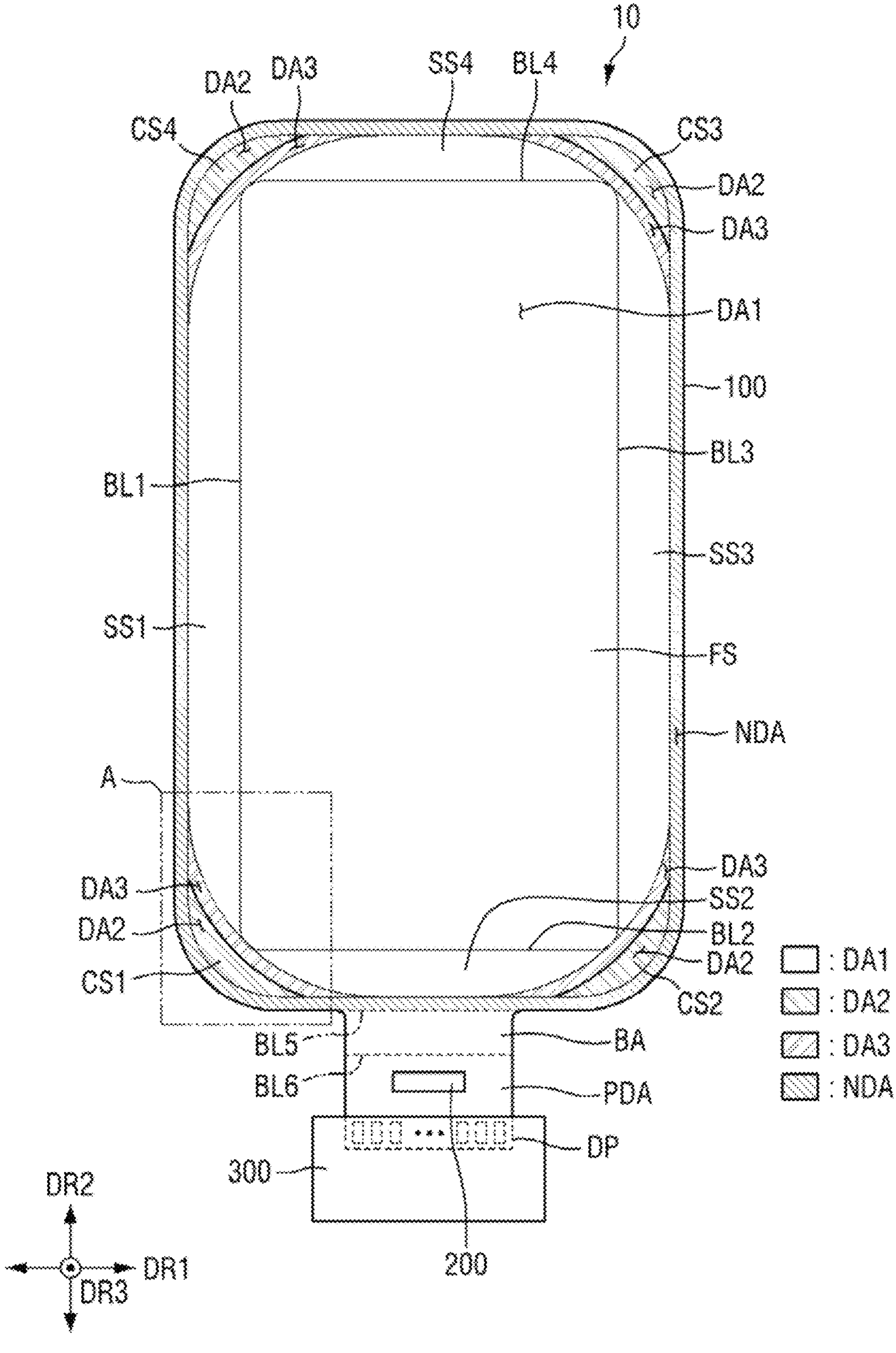
FIG. 2 is an elevational view of a display device according to an embodiment.

FIG. 1 is a perspective view of a display device according to an embodiment, and FIG. 2 is a schematic elevational view of a display device according to an embodiment.

Referring to FIGS. 1 and 2, a display device 10 according to an embodiment can be incorporated into a portable electronic device such as a mobile phone, a smart phone, a tablet personal computer (PC), a mobile communication terminal, an electronic diary, an electronic book, a portable multimedia player (PMP), a navigator and an ultra mobile PC (UMPC). In addition, the display device 10 according to an embodiment can be incorporated into a television, a laptop computer, a monitor, a signboard or a display unit of Internet of things (IoT). The display device 10 according to an embodiment can also be incorporated into a wearable device such as a smart watch, a watch phone, an eyeglasses-type display and a head mounted display (HMD). In addition, the display device 10 according to an embodiment can be incorporated into a dashboard of a vehicle, a center fascia of a vehicle, a center information display (CID) disposed on a dashboard of a vehicle, a room mirror display that replaces a side mirror of a vehicle or a display disposed on a rear surface of a front seat as an entertainment for a rear seat of a vehicle.

The display device 10 according to an embodiment includes a display panel 100 that includes a front portion FS, a first side portion SS1, a second side portion SS2, a third side portion SS3, a fourth side portion SS4, a first corner portion CS1, a second corner portion CS2, a third corner portion CS3, and a fourth corner portion CS4.

In an embodiment, a first direction DR1 is a short side direction of the display device 10, and is, for example, a horizontal direction of the display device 10. A second direction DR2 is a long side direction of the display device 10, and is, for example, a vertical direction of the display device 10. A third direction DR3 is a thickness direction of the display device 10.

In some embodiments, the display panel 100 includes elements and circuits that display an image, such as a pixel circuit that includes a switching element, and a light emitting element. In an embodiment, the light emitting element is at least one of an organic light emitting diode, a quantum dot light emitting diode, an inorganic-based micro light emitting diode, such as a micro LED, or an inorganic-based light emitting diode, such as a nano LED, in which at least one of a width or a length has a nano size. Hereinafter, for convenience of description, the light emitting element will be described as an organic light emitting element as an example.

The front portion FS has a rectangular planar shape with a short side in the first direction DR1 and a long side in the second direction DR2, but is not necessarily limited thereto. In embodiments, the front portion FS has other shapes, such as a polygonal, circular or oval planar shape, in addition to a rectangular planar shape. In FIG. 1, the front portion FS is shown as being flat, but is not necessarily limited thereto. In some embodiments, the front portion FS includes a curved surface.

The first side portion SS1 extends from a first side of the front portion FS. The first side portion SS1 is bent from the first side of the front portion FS along a first bending line BL1 of FIG. 2, and thus has a first curvature. In some embodiments, the first side of the front portion FS is a left side of the front portion FS or one side in the first direction DR1 as shown in FIGS. 1 and 2.

The second side portion SS2 extends from a second side of the front portion FS. The second side portion SS2 is bent from the second side of the front portion FS along a second bending line BL2 of FIG. 2, and thus has a second curvature. The second curvature may differ from the first curvature, but is not necessarily limited thereto. The second side of the front portion FS is a lower side of the front portion FS or one side in the second direction DR2 as shown in FIGS. 1 and 2.

The third side portion SS3 extends from a third side of the front portion FS. The third side portion SS3 is bent from the third side of the front portion FS along a third bending line BL3 of FIG. 2, and thus has a third curvature. The third curvature may be the same as the first curvature, but is not necessarily limited thereto. The third side of the front portion FS is a right side of the front portion FS or the other side in the first direction DR1 as shown in FIGS. 1 and 2.

The fourth side portion SS4 extends from a fourth side of the front portion FS. The fourth side portion SS4 is bent from the fourth side of the front portion FS along a fourth bending line BL4 of FIG. 2, and thus has a fourth curvature. The fourth curvature may be the same as the second curvature, but is not necessarily limited thereto. The fourth side of the front portion FS is an upper side of the front portion FS or the other side in the second direction DR2 as shown in FIGS. 1 and 2.

The first corner portion CS1 is disposed between the first side portion SS1 and the second side portion SS2. In some embodiments, the first corner portion CS1 adjoins a lower side of the first side portion SS1 and a let side of the second side portion SS2. The first corner portion CS1 is a double curvature area bent by the first curvature of the first side portion SS1 and the second curvature of the second side portion SS2. For this reason, the first corner portion CS1 may be subject to strain due a force resulting from the first curvature of the first side portion SS1 and a force resulting from the second curvature of the second side portion SS2.

The second corner portion CS2 is disposed between the second side portion SS2 and the third side portion SS3. For example, the second corner portion CS2 adjoins a right side of the second side portion SS2 and a lower side of third side portion SS3. The second corner portion CS2 is a double curvature area bent by the second curvature of the second side portion SS2 and the third curvature of the third side portion SS3. For this reason, the second corner portion CS2 may be subject to strain due a force resulting from the second curvature of the second side portion SS2 and a force resulting from the third curvature of the third side portion SS3.

The third corner portion CS3 is disposed between the third side portion SS3 and the fourth side portion SS4. For example, the third corner portion CS3 adjoins an upper side of the third side portion SS3 and a right side of the fourth side portion SS4. The third corner portion CS3 is a double curvature area bent by the third curvature of the third side portion SS3 and the fourth curvature of the fourth side portion SS4. For this reason, the third corner portion CS3 may be subject to strain due a force resulting from the third curvature of the third side portion SS3 and a force resulting from the fourth curvature of the fourth side portion SS4.

The fourth corner portion CS4 is disposed between the first side portion SS1 and the fourth side portion SS4. For example, the fourth corner portion CS4 adjoins an upper side of the first side portion SS1 and a left side of the fourth side portion SS4. The fourth corner portion CS4 is a double curvature area bent by the first curvature of the first side portion SS1 and the fourth curvature of the fourth side portion SS4. For this reason, the fourth corner portion CS4 may be subject to strain due a force resulting from the first curvature of the first side portion SS1 and a force resulting from the fourth curvature of the fourth side portion SS4.

Each of the first corner portion CS1, the second corner portion CS2, the third corner portion CS3 and the fourth corner portion CS4 includes cut-out patterns partitioned by cut-out portions that reduce strain caused by the double curvature. The cut-out patterns will be described below.

The display panel 100 further include a bendable area BA and a pad area PA. For example, the display panel 100 includes a first display area DA1, a plurality of second display areas DA2, a plurality of third display areas DA3, a non-display area NDA, a bendable area BA and a pad area PA.

The first display area DA1, the second display area DA2 and the third display area DA3 are areas that include pixels or light emission areas that display an image. The non-display area NDA does not include pixels or light emission areas and thus does not display an image. In some embodiments, signal lines or a scan driver that drives the pixels or light emission areas are disposed in the non-display area NDA.

The first display area DA1 is a main display area of the display panel 100, and is located in the front portion FS, the first side portion SS1, the second side portion SS2, the third side portion SS3 and the fourth side portion SS4. Each corner of the first display area DA1 is rounded with a predetermined curvature.

Each of the second display areas DA2 is a second auxiliary display area that assists the main first display area DA1. A resolution of each of the second display areas DA2 differs from that of the first display area DAL. For example, since the second display area DA2 assists the first display area DA1, resolution of the second display area DA2 is lower than that of the first display area DA1. For example, the number of pixels per unit area in the second display area DA2 is less than the number of pixels per unit area in the first display area DA1, but embodiments of the present disclosure are not necessarily limited thereto. In some embodiments, the resolution of the second display area DA2 is substantially the same as that of the first display area DA1.

The second display areas DA2 are disposed outside of the corners of the first display area DA1. The second display areas DA2 are disposed on the corner portions CS1 to CS4.

For example, a second display area DA2 is disposed on the first corner portion CS1 where a lower side and a left side of the first display area DA1 meet. A second display area DA2 is disposed on the second corner portion CS2 where the lower side and a right side of the first display area DA1 meet. A second display area DA2 is disposed on the third corner portion CS3 where the upper side and the right side of the first display area DA1 meet. A second display area DA2 is disposed on the fourth corner portion CS4 where the upper side and the left side of the first display area DA1 meet.

The third display areas DA3 are a second auxiliary display area that assist the main first display area DAL. In some embodiments, a resolution of the third display area DA3 differs from that of the first display area DAL. For example, since the third display area DA3 assists the first display area DA1, resolution of the third display area DA3 is lower than that of the first display area DA1. For example, the number of pixels per unit area in the third display area DA3 is less than the number of pixels per unit area in the first display area DAL. Alternatively, the number of pixels PPI (pixels per inch) in the third display area DA2 is less than the number of pixels PPI in the first display area DA1, but embodiments of the present disclosure are not necessarily limited thereto. In some embodiments, the resolution of the third display area DA3 is substantially the same as that of the first display area DAL.

The third display areas DA3 are disposed between the first display area DA1 and the second display areas DA2. The third display area DA3 are disposed on the corner portions CS1 to CS4.

For example, a third display area DA3 is disposed on the first corner portion CS1 where the lower side and the left side of the first display area DA1 meet. A third display area DA3 is disposed on the second corner portion CS2 where the lower side and the right side of the first display area DA1. A third display area DA3 is disposed on the third corner portion CS3 where the upper side and the right side of the first display area DA1 meet. A third display area DA3 is disposed on the fourth corner portion CS4 where the upper side and the left side of the first display area DA1 meet.

The non-display area NDA is disposed on the first side portion SS1, the second side portion SS2, the third side portion SS3, the fourth side portion SS4, the first corner portion CS1, the second corner portion CS2, the third corner portion CS3 and the fourth corner portion CS4. The non-display area NDA is disposed outside of the first display area DA1 on the side portions SS1, SS2, SS3 and SS4. For example, the non-display area NDA is disposed at a left edge of the first side portion SS1, a lower edge of the second side portion SS2, a right edge of the third side portion SS3 and an upper edge of the fourth side portion SS4.

The non-display area NDA is disposed outside of the second display areas DA2 on the corner portions CS1, CS2, CS3 and CS4. For example, the non-display area NDA is disposed at the edge of the first corner portion CS1 where an lower side and a left side of the first display area DA1 meet, the edge of the second corner portion CS2 where a lower side and a right side of the first display area DA1 meet, the edge of the third corner portion CS3 where an upper side and a right side of the first display area DA1 meet, and the edge of the fourth corner portion CS4 where an upper side and a left side of the first display area DA1 meet.

The bendable area BA extends from the lower side of the second side portion SS2. The bendable area BA is disposed between the second side portion SS2 and the pad area PA. A length of the bendable area BA in the first direction DR1 is less than that of the second side portion SS2 in the first direction DR1. The bendable area BA can be bent along a fifth bending line BL5 at the lower side of the second side portion SS2.

The pad area PA extends from a lower side of the bendable area BA. A length of the pad area PA in the first direction DR1 is greater than that of the bendable area BA in the first direction DR1, but is not necessarily limited thereto. In an embodiment, the length of the pad area PA in the first direction DR1 is substantially equal to that of the bendable area BA in the first direction DR1. The pad area PA is bent along a sixth bending line BL6 at the lower side of the bendable area BA. The pad area PA is disposed on a lower surface of the front portion FS.

A display driving circuit 200 and pads DP are disposed on the pad area PA. The display driving circuit 200 is an integrated circuit (IC). The display driving circuit 200 is attached onto the pad area PA by a chip on plastic (COP) method or an ultrasonic bonding method. Alternatively, the display driving circuit 200 is disposed on a display circuit board 300 that is disposed on the pads DP of the pad area PA.

The display circuit board 300 is attached onto the pads DP of the pad area PA. As a result, the pads DP of the pad area PA are electrically connected to the display circuit board 300.

As shown in FIG. 2, the display areas DA1, DA2 and DA3 are located on the front portion FS, the first side portion SS1, the second side portion SS2, the third side portion SS3, the fourth side portion SS4, the first corner portion CS1, the second corner portion CS2, the third corner portion CS3 and the fourth corner portion CS4 of the display panel 100. Therefore, an image can be displayed on the first corner portion CS1, the second corner portion CS2, the third corner portion CS3 and the fourth corner portion CS4 as well as the front portion FS, the first side portion SS1, the second side portion SS2, the third side portion SS3 and the fourth side portion SS4 of the display panel 100.

Figure 3:
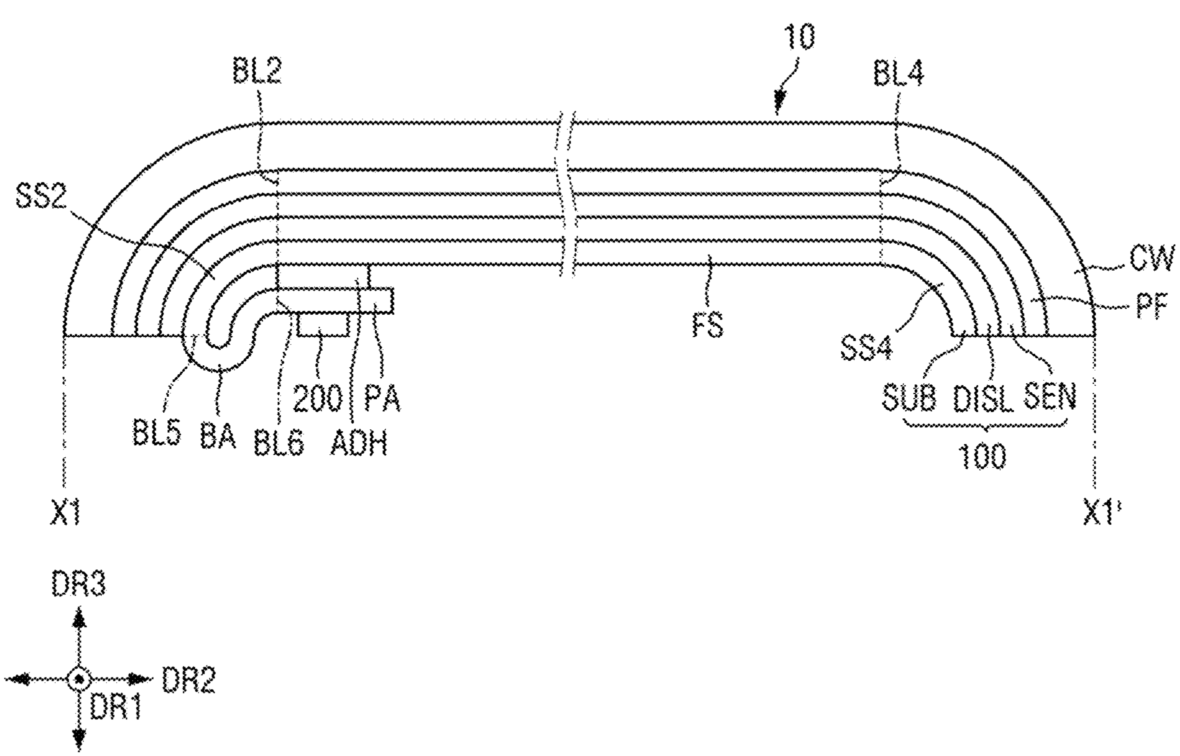
FIG. 3 is a schematic cross-sectional view of a display device taken along line X1-X1' of FIG. 1.

FIG. 3 is a schematic cross-sectional view of a display device taken along line X1-X1' of FIG. 1.

Referring to FIG. 3, in some embodiments, the display device 10 includes a cover window CW and a polarizing film PF in addition to the display panel 100.

In some embodiments, the display panel 100 includes a substrate SUB, a display layer DISL, and a sensor electrode layer SEN. The polarizing film PF is disposed on the display panel 100, and the cover window CW is disposed on the polarizing film PF.

The substrate SUB is formed of an insulating material. In some embodiments, the substrate SUB is a flexible substrate, and includes an insulating material such as a polymer resin. Examples of the polymer resin include polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), or cellulose acetate propionate (CAP), or their combination. When the substrate SUB is flexible, the substrate SUB is a flexible substrate that can be bent, folded, rolled, etc.

The display layer DISL is disposed on the substrate SUB. The display layer DISL includes display areas DA1, DA2 and DA3 of FIG. 2 and a non-display area NDA. In some embodiments, the display layer DISL includes a thin film transistor layer, a light emitting element layer that includes light emitting elements that emit light, and an encapsulation layer that encapsulates the light emitting element layer.

The sensor electrode layer SEN, the polarizing film PF and the cover window CW are disposed on the second side portion SS2 and the third side portion SS3. In addition, the sensor electrode layer SEN, the polarizing film PF and the cover window CW are disposed on the first side portion SS1 and the fourth side portion SS4.

The bendable area BA is bent from the fifth bending line BL5 and is disposed on a lower surface of the second side portion SS2. The pad area PA is bent from the sixth bending line BL6 and disposed on a lower surface of the front portion FS. The pad area PA is attached to the lower surface of the front portion FS by an adhesive member ADH. In some embodiments, the adhesive member ADH is a pressure sensitive adhesive.

Figure 4:
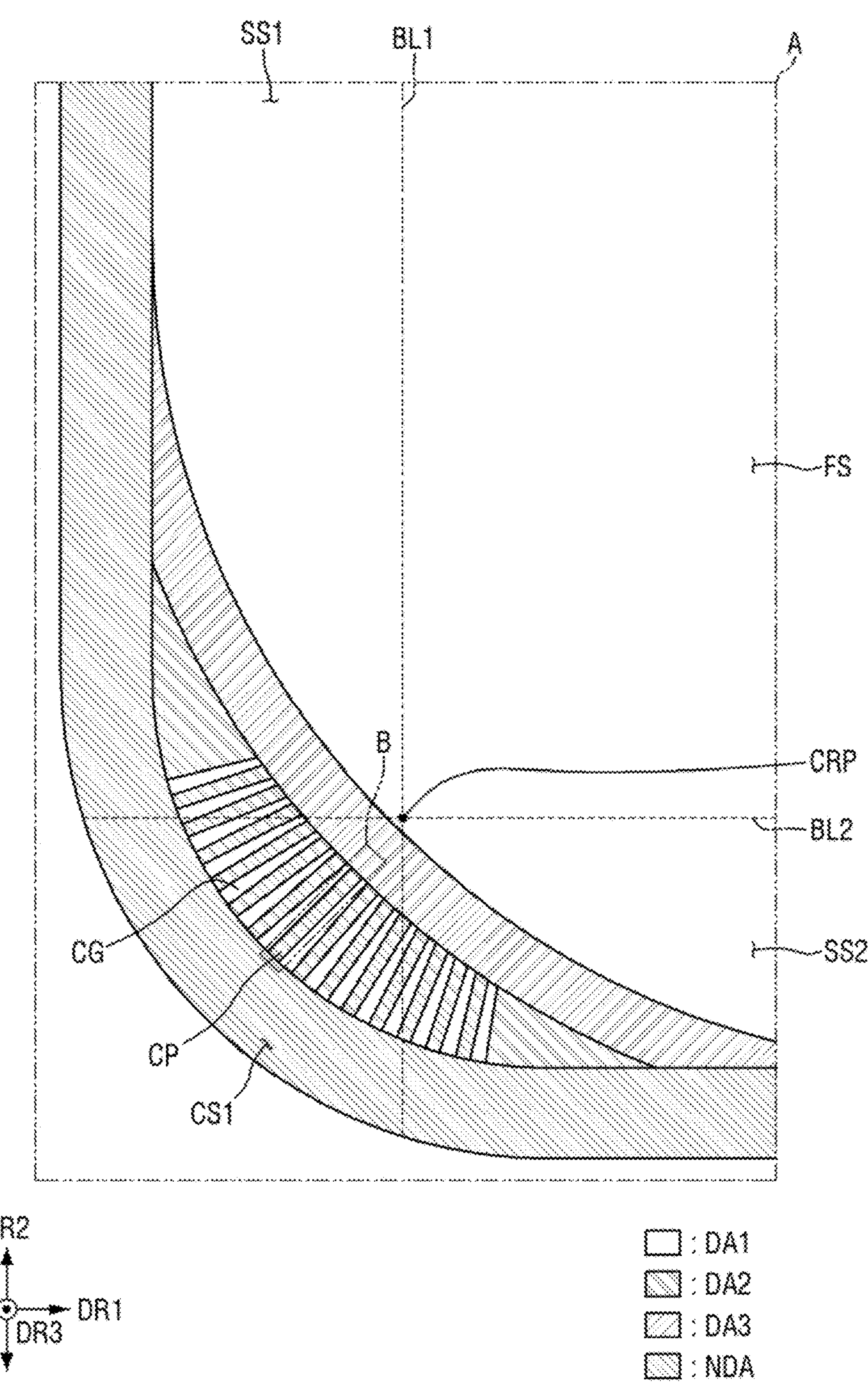
FIG. 4 is a schematic plan view of an area A of FIG. 2, which schematically shows a layout of a first display area, a second display area, a third display area and a non-display area, which are disposed on a first corner portion of a display panel.

FIG. 4 is a schematic plan view of an area A of FIG. 2, which schematically shows a layout of a first display area, a second display area, a third display area and a non-display area disposed on a first corner portion of a display panel.

Referring to FIGS. 2 and 4, in some embodiments, a crossing point CRP of the first bending line BL1 and the second bending line BL2 is located in the first display area DA1. For example, the first display area DA1 is disposed on the front portion FS, the first side portion SS1, the second side portion SS2 and the first corner portion CS1. In addition, the second display area DA2 and the third display area DA3 are disposed on the first corner portion CS. The non-display area NDA is disposed on the first side portion SS1, the second side portion SS2 and the first corner portion CS1.

However, the position of the crossing point CRP of the first bending line BL1 and the second bending line BL2 is not necessarily limited to the example shown in FIG. 4, and in other embodiments, the crossing point CRP of the first bending line BL1 and the second bending line BL2 is located in the third display area DA3, or at a boundary between the first display area DA1 and the third display area DA3.

The first display area DA1 includes first pixels that display an image.

The second display area DA2 is disposed outside the third display area DA3. The second display area DA2 includes second pixels that display an image.

The third display area DA3 is disposed between the first display area DA1 and the second display area DA2. The third display area DA3 includes third pixels that display an image.

When the non-display area is disposed between the first display area DA1 and the second display area DA2 instead of the third display area DA3, a user can recognize the non-display area between the first display area DA1 and the second display area DA2. For example, a user can recognize a gap between an image displayed by the first display area DA1 and an image displayed by the second display area DA2. When the third display area DA3 is disposed between the first display area DA1 and the second display area DA2, the gap between the image displayed by the first display area DA1 and the image displayed by the second display area DA2 is not visible to the user.

The second display area DA2 includes cut-out patterns CP and cut-out portions CG. The second pixels are disposed on the cut-out patterns CP. The cut-out patterns CP can be formed by various processes, such as cutting some or all of the display panel 100 by laser or etching some or all of the display panel 100 by an etching process. For example, the cut-out patterns CP are formed by partially removing the thin film transistor layer, the light emitting device layer and the encapsulation layer of the display panel 100. In some embodiments, the substrate of the display panel 100 is also removed from the cut-out pattern CP.

One end of each of the cut-out patterns CP is connected to the third display area DA3, and the other end thereof is connected to the non-display area NDA. Adjacent cut-out patterns CP are spaced apart from each other by the cut-out portions CG. A space is provided between adjacent cut-out patterns CP by the cut-out portion CG. As a result, even though the first corner portion CS1 has a double curvature, the first corner portion CS1 is elongated and contracted, and thus strain or stress applied to the first corner portion CS1 by the cut-out portions CG is reduced.

In some embodiments, a scan driver is further disposed in the third display area DA3. The scan driver transmits scan signals to at least one of the first pixels of the first display area DA1, the second pixels of the second display area DA2 or the third pixels of the third display area DA3. For example, not only the third pixels but also the scan driver can be disposed in the third display area DA3.

The display areas DA1, DA2, and DA3 and the non-display area NDA that are disposed in the second corner portion CS2, the third corner portion CS3 and the fourth corner portion CS4 and that are shown in FIG. 2, are similar to those described with reference to FIG. 4. Therefore, the description of the second corner portion CS2, the third corner portion CS3 and the fourth corner portion CS4 will be omitted.

Figure 5:
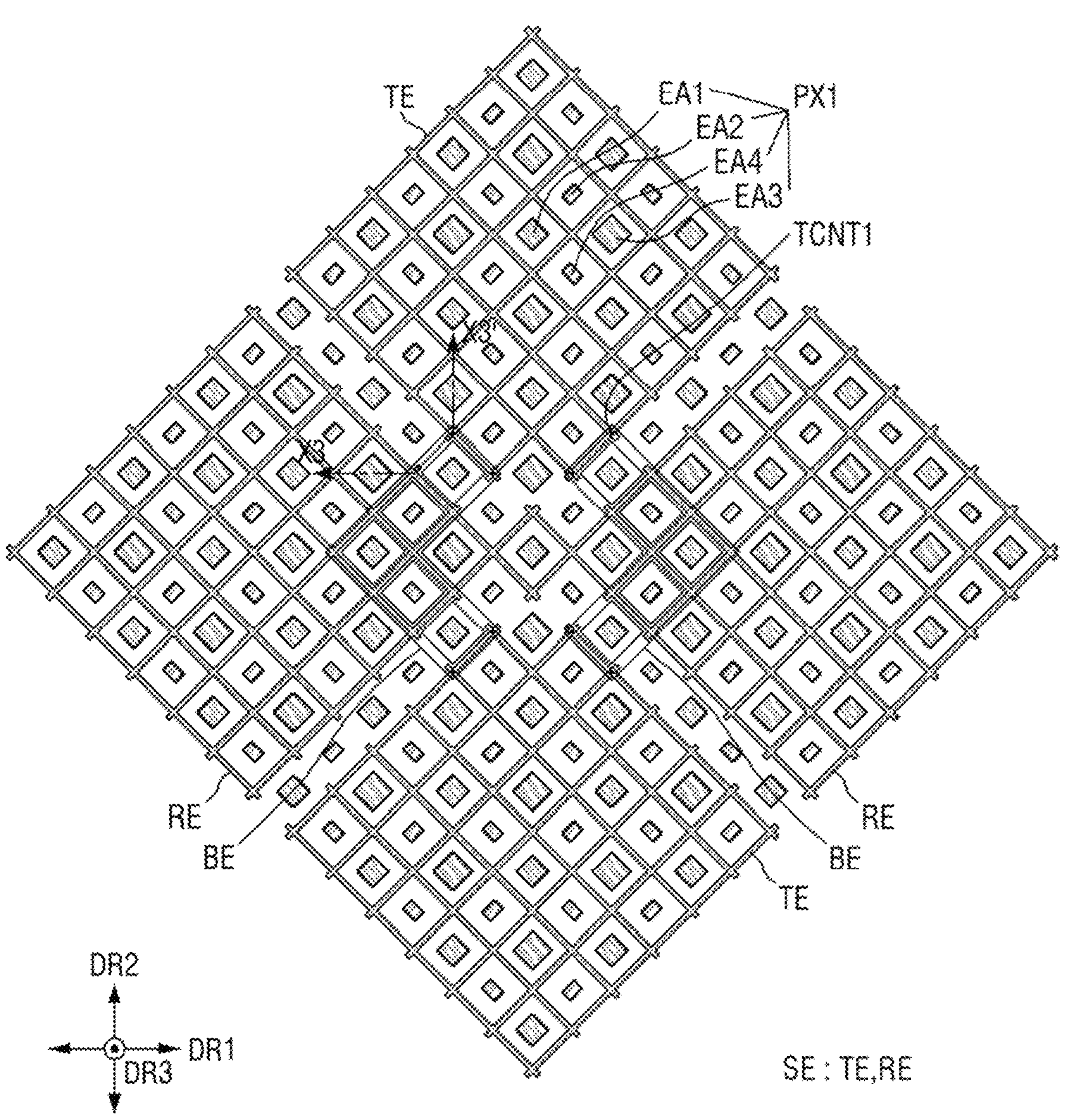
FIG. 5 is an enlarged plan view of a first display area of FIG. 1.

FIG. 5 is an enlarged plan view of a portion of a first display area of FIG. 4.

FIG. 5 illustrates first pixels PX1 of the first display area DA1 of FIG. 4, and driving electrodes TE and sensing electrodes RE of the sensor electrode layer SENL of FIG. 3. In addition, FIG. 5 illustrates that the sensor electrode layer SENL senses a user's touch using mutual capacitance. For convenience of description, two sensing electrodes RE adjacent to each other in the first direction DR1 and two driving electrodes TE adjacent to each other in the second direction DR2 are shown in FIG. 5.

Referring to FIGS. 4 and 5, in an embodiment, the driving electrodes TE and the sensing electrodes RE are disposed in the first display area DAL. The driving electrodes TE and the sensing electrodes RE are electrically separated from each other. The driving electrodes TE and the sensing electrodes RE are disposed in a same layer, and are spaced apart from each other. A gap is present between the driving electrode TE and the sensing electrode RE.

In some embodiments, the sensing electrodes RE are electrically connected to each other in the first direction DR1. In some embodiments, the driving electrodes TE are electrically connected to each other in the second direction DR2. To electrically separate the sensing electrodes RE and the driving electrodes TE from each other at their crossing points, the driving electrodes TE adjacent to each other in the second direction DR2 are connected to each other through touch connection electrodes BE.

The touch connection electrode BE is formed on a different layer from the driving electrodes TE and the sensing electrodes RE, and is connected to the driving electrodes TE through first touch contact holes TCNT1. One end of the touch connection electrode BE is connected to one of the driving electrodes TE through the first touch contact holes TCNT1. The other end of the touch connection electrode BE is connected to the other driving electrode TE through the first touch contact holes TCNT1. The touch connection electrode BE overlaps the sensing electrode RE in the third direction DR3. Since the touch connection electrode BE is formed in a different layer from the driving electrodes TE and the sensing electrodes RE, the touch connection electrode BE are electrically separated from the sensing electrode RE even though it overlaps the sensing electrode RE in the third direction DR2.

In some embodiments, the touch connection electrodes BE have at least one bent portion. In FIG. 5, although the touch connection electrodes BE are bent in a clamp shape such as "<" or ">", the shape of the touch connection electrodes BE is not necessarily limited thereto. In some embodiments, since the driving electrodes TE adjacent to each other in the second direction DR2 are connected to each other by the plurality of touch connection electrodes BE, the driving electrodes TE adjacent to each other in the second direction DR2 will remain electrically connected to each other even if one of the touch connection electrodes BE is disconnected. Therefore, reliability of the sensor electrode layer SENL is increased.

Each of the driving electrodes TE and the sensing electrodes RE has a planar shape of a mesh structure or a netted structure. Since the driving electrodes TE and the sensing electrodes RE are disposed on the encapsulation layer as described below, a distance between a common electrode and the driving electrode TE or the sensing electrode RE is small. Therefore, a parasitic capacitance can form between the common electrode and the driving electrode TE or the sensing electrode RE. The driving electrodes TE and the sensing electrodes RE have a planar mesh or netted structure, and thus an overlap area between the common electrode and the driving electrode TE or the sensing electrode RE is reduced. As a result, the parasitic capacitance is reduced.

The first display area DA1 includes first pixels PX1 that display an image. Each of the first pixels PX1 includes a plurality of light emission areas EA1, EA2, EA3 and EA4. For example, each of the first pixels PX1 includes a first light emission area EA1, a second light emission area EA2, a third light emission area EA3 and a fourth light emission area EA4. For example, the first light emission area EA1 is a light emission area of a first subpixel that emits first light, the second light emission area EA2 is a light emission area of a second subpixel that emits second light, the third light emission area EA3 is a light emission area of a third subpixel that emits third light, and the fourth light emission area EA4 is a light emission area of a fourth subpixel that emits fourth light.

Each of the first light emission area EA1, the second light emission area EA2, the third light emission area EA3 and the fourth light emission area EA4 emits light of a different color. In an embodiment, any two of the first light emission area EA1, the second light emission area EA2, the third light emission area EA3 and the fourth light emission area EA4 emit light of the same color. For example, the first light emission area EA1 emits red light, the second light emission area EA2 and the fourth light emission area EA4 emit green light, and the third light emission area EA3 emits blue light.

The first light emission area EA1, the second light emission area EA2, the third light emission area EA3 and the fourth light emission area EA4 are illustrated as having a rectangular planar shape such as rhombus, but embodiments are not necessarily limited thereto. For example, in embodiments, the first light emission area EA1, the second light emission area EA2, the third light emission area EA3 and the fourth light emission area EA4 have other shapes, such as a polygonal, circular or oval planar shape, in addition to the rectangular planar shape. In some embodiments, sizes of at least two of the first light emission area EA1, the second light emission area EA2, the third light emission area EA3 and the fourth light emission area E4 differ from each other.

For example, when the first light emission are EA1 emits red light, the second light emission area EA2 and the fourth light emission area EA4 emit green light, and the third light emission area EA3 emits blue light, the size of the third light emission area EA3 is the largest, the size of the first light emission area EA1 is the second largest, and the size of each of the second light emission area EA2 and the fourth light emission area EA4 is smaller than that of the third light emission area EA3 and that of the first light emission area EA1, but embodiments of the present disclosure are not necessarily limited thereto. Various modifications can be made in the sizes of the first light emission area EA1, the second light emission area EA2, the third light emission area EA3 and the fourth light emission area EA4.

Since the driving electrodes TE, the sensing electrodes RE and the touch connection electrodes BE are formed in a planar mesh structure or a planar netted structure, the light emission areas EA1, EA2, EA3 and EA4 do not overlap the driving electrodes TE, the sensing electrodes RE and the touch connection electrodes BE in the third direction DR3. Therefore, light can be emitted from the light emission areas EA1, EA2, EA3 and EA4 without being shielded by the driving electrodes TE, the sensing electrodes RE and the touch connection electrodes BE.

Figure 6:
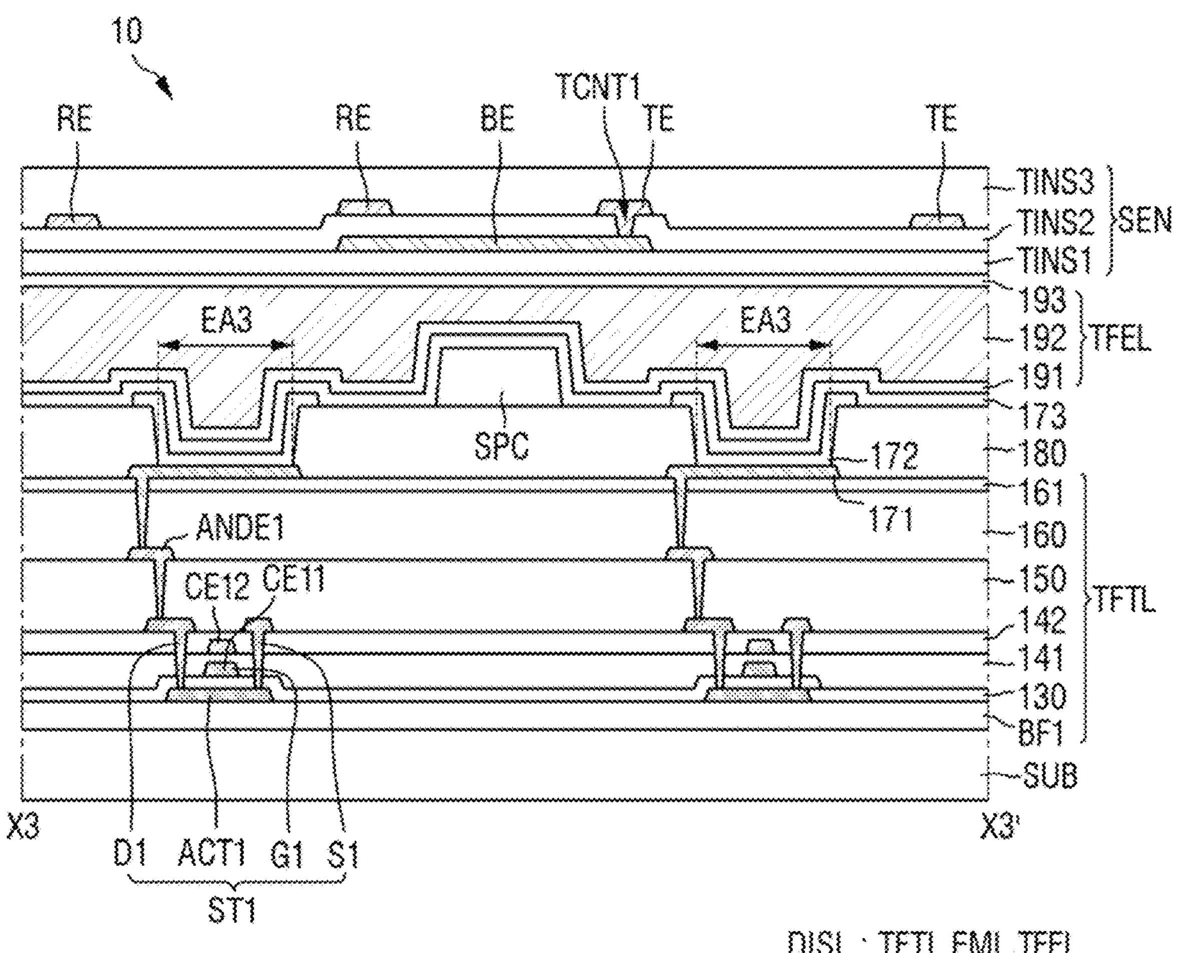
FIG. 6 is a schematic cross-sectional view of a display device taken along line X3-X3' of FIG. 5.

FIG. 6 is a schematic cross-sectional view of a display device taken along line X3-X3' of FIG. 5. FIG. 6 shows elements of a display device.

Referring to FIG. 6, in an embodiment, a display layer DISL, which includes a thin film transistor layer TFTL, a light emitting element layer EML and an encapsulation layer TFEL, is disposed on a substrate SUB, and a sensor electrode layer SEN, which includes driving electrodes TE, sensing electrodes RE and touch connection electrodes BE, is disposed on the display layer DISL.

The thin film transistor layer TFTL is disposed on the substrate SUB. The thin film transistor layer TFTL includes a first thin film transistor ST1, a pixel connection electrode ANDE1, a buffer layer BF1, a gate insulating layer 130, a first interlayer insulating layer 141, a second interlayer insulating layer 142, a first insulating layer 150, a second insulating layer 160, and barrier layer 161.

The buffer layer BF1 is disposed on the substrate SUB. The buffer layer BF1 is formed of at least one of a silicon nitride layer, a silicon oxynitride layer, a silicon oxide layer, a titanium oxide layer or an aluminum oxide layer.

The first thin film transistor ST1 is disposed on the buffer layer BF1. The first thin film transistor ST1 includes a first active layer ACT1, a first gate electrode G1, a first source electrode S1 and a first drain electrode D1.

A first active layer ACT1 of the first thin film transistor ST1 is disposed on the buffer layer BF1. In some embodiments, the first active layer ACT1 includes a silicon semiconductor such as polycrystalline silicon, monocrystalline silicon, low temperature polycrystalline silicon or amorphous silicon. A portion of the first active layer ACT1 that overlaps the first gate electrode G1 along the third direction DR3 may be defined as a channel area. A portion of the first active layer ACT1 that does not overlap the first gate electrode G1 along the third direction DR3 may be defined as a conductive area. The conductive area of the first active layer ACT1 acquires conductivity by having ions or impurities doped on the silicon semiconductor.

The gate insulating layer 130 is disposed on the buffer layer BF1 and the first active layer ACT1 of the first thin film transistor ST1. The gate insulating layer 130 includes an inorganic layer, such as one of a silicon nitride layer, a silicon oxynitride layer, a silicon oxide layer, a titanium oxide layer or an aluminum oxide layer.

The first gate electrode G1 of the first thin film transistor ST1 is disposed on the gate insulating layer 130. The first gate electrode G1 of the first thin film transistor ST1 overlaps the first active layer ACT1 in the third direction DR3. In some embodiments, the first gate electrode G1 is a first capacitor electrode CE11 of a first storage capacitor CAP1. In some embodiments, the first gate electrode G1 overlaps a second capacitor electrode CE12 of the first storage capacitor CAP1. The first gate electrode G1 may be formed as a single layer or as multiple layers that include one or more of molybdenum (Mo), aluminum (Al), chromium (Cr), gold (Au), titanium (Ti), nickel (Ni), neodymium (Nd) or copper (Cu), or their alloy.

The first interlayer insulating layer 141 is disposed on the first gate electrode G1 and the gate insulating layer 130. The first interlayer insulating layer 141 includes an inorganic layer, such as one of a silicon nitride layer, a silicon oxynitride layer, a silicon oxide layer, a titanium oxide layer or an aluminum oxide layer. In some embodiments, the first interlayer insulating layer 141 includes a plurality of inorganic layers.

The second capacitor electrode CE12 is disposed on the first interlayer insulating layer 141. The second capacitor electrode CE12 overlaps the first capacitor electrode CE11 or the first gate electrode G1 in the third direction DR3. Since the first interlayer insulating layer 141 has a predetermined dielectric constant, the first storage capacitor CAP1 is formed by the first capacitor electrode CE11, the second capacitor electrode CE12 and the first interlayer insulating layer 141. The second capacitor electrode CE12 may be formed as a single layer or as multiple layers that include one or more of molybdenum (Mo), aluminum (Al), chromium (Cr), gold (Au), titanium (Ti), nickel (Ni), neodymium (Nd) or copper (Cu), or their alloy.

The second interlayer insulating layer 142 is disposed on the second capacitor electrode CE12 and the first interlayer insulating layer 141. The second interlayer insulating layer 142 includes an inorganic layer, such as one of a silicon nitride layer, a silicon oxynitride layer, a silicon oxide layer, a titanium oxide layer or an aluminum oxide layer.

The first source electrode S1 and the first drain electrode D1 of the first thin film transistor ST1 are disposed on the second insulating interlayer 142. The first source electrode S1 and the first drain electrode D1 may be formed as a single layer or as multiple layers that include one or more of molybdenum (Mo), aluminum (Al), chromium (Cr), gold (Au), titanium (Ti), nickel (Ni), neodymium (Nd) or copper (Cu), or their alloy.

The first source electrode S1 of the first thin film transistor ST1 is connected to the conductive area disposed on one side of the channel area of the first active layer ACT1 through a contact hole that penetrates through the gate insulating layer 130, the first interlayer insulating layer 141 and the second interlayer insulating layer 142. The first drain electrode D1 of the first thin film transistor ST1 is connected to the conductive area disposed on the other side of the channel area of the first active layer ACT1 through a contact hole that penetrates through the gate insulating layer 130, the first interlayer insulating layer 141 and the second interlayer insulating layer 142.

In some embodiments, the first source electrode S1 and the first drain electrode D1 include a conductive material such as at least one of molybdenum (Mo), aluminum (Al), copper (Cu), or titanium (Ti), etc., and may be formed as multiple layers or as a single layer that include(s) the above material. For example, the first source electrode S1 and the first drain electrode D1 are formed of multiple layers of Ti/Al/Ti.

The first insulating layer 150 is disposed on the first source electrode S1 and the first drain electrode D1 and the second insulating interlayer 142. In some embodiments, the first insulating layer 150 is a planarization layer that planarizes step differences caused by the thin film transistors. The first insulating layer 150 includes an organic insulating material such as an acrylic resin, an epoxy resin, a phenolic resin, a polyamide resin or a polyimide resin.

The pixel connection electrode ANDE1 is disposed on the first insulating layer 150. The pixel connection electrode ANDE1 is connected to the first drain electrode D1 of the first thin film transistor ST1 through a contact hole that penetrates through the first insulating layer 150. The pixel connection electrode ANDE1 may be formed as a single layer or as multiple layers that include one or more of molybdenum (Mo), aluminum (Al), chromium (Cr), gold (Au), titanium (Ti), nickel (Ni), neodymium (Nd) or copper (Cu), or their alloy. For example, the pixel connection electrode ANDE1 is formed of multiple layers of Ti/Al/Ti.

The second insulating layer 160 is disposed on the pixel connection electrode ANDE1 and the first insulating layer 150. The second insulating layer 160 is a planarization layer. In some embodiments, the second insulating layer 160 includes an organic insulating material such as an acrylic resin, an epoxy resin, a phenolic resin, a polyamide resin or a polyimide resin.

The barrier layer 161 is disposed on the second insulating layer 160. In some embodiments, the barrier layer 161 includes an inorganic insulating material. For example, the barrier layer 161 is formed of one of a silicon nitride layer, a silicon oxynitride layer, a silicon oxide layer, a titanium oxide layer or an aluminum oxide layer.

The light emitting element layer EML is disposed on the thin film transistor layer TFTL. The light emitting element layer EML includes first light emitting elements 170 and a bank 180.

Each of the first light emitting elements 170 include a first pixel electrode 171, a first light emitting layer 172 and a first common electrode 173. Each of the light emission areas EA1, EA2, EA3 and EA4 refers to an area where the first pixel electrode 171, the first light emitting layer 172 and the first common electrode 173 are sequentially stacked so that holes from the first pixel electrode 171 and electrons from the first common electrode 173 combine with each other in the first light emitting layer 172 to emit light. For example, the first pixel electrode 171 is an anode electrode, and the first common electrode 173 is a cathode electrode. The first light emission area EA1, the second light emission area EA2 and the fourth light emission area EA4 are substantially the same as the third light emission area EA3 shown in FIG. 6.

The first pixel electrode 171 is disposed on the barrier layer 161. The first pixel electrode 171 is connected to the pixel connection electrode ANDE1 through a contact hole that passes through the barrier layer 161 and the second insulating layer 160.

In a top emission structure in which light is emitted toward the first common electrode 173 from the first light emitting layer 172, the first pixel electrode 171 includes a conductive oxide such as indium tin oxide (ITO), indium zinc oxide (IZO), zinc oxide (ZnO), indium oxide ($In_2O_3$), indium gallium oxide (IGO) or aluminum zinc oxide (AZO). Alternatively, the first pixel electrode 171 includes at least one of silver (Ag), magnesium (Mg), platinum (Pt), palladium (Pd), gold (Au), nickel (Ni), molybdenum (Mo), titanium (Ti), copper (Cu), or aluminum (Al), etc. In some embodiments, the first pixel electrode 171 has a multi-layered structure, such as a stacked structure (Ti/Al/Ti) of aluminum and titanium, a stacked structure (ITO/A/ITO) of aluminum and ITO, a stacked structure (ITO/Ag/ITO) of Ag and ITO, an APC alloy, or a stacked structure (ITO/APC/ITO) of APC alloy and ITO. The APC alloy is an alloy of silver (Ag), palladium (Pd) and copper (Cu).

The bank 180 defines the light emission areas EA1, EA2, EA3 and EA4 of pixels. For example, the bank 180 is a pixel defining layer. The bank 180 exposes a portion of the first pixel electrode 171 on the barrier layer 161. The bank 180 covers an edge of the first pixel electrode 171. In some embodiments, the bank 180 include an organic insulating material such as one of an acrylic resin, an epoxy resin, a phenolic resin, a polyamide resin or a polyimide resin.

A spacer SPC is disposed on the bank 180. The spacer SPC is disposed at a portion that does not overlap any of the light emission areas EA1, EA2, EA3 and EA4. The spacer SPC prevents scratches from occurring during a mask process. Alternatively, the spacer SPC protects the light emitting element layer EML or the light emitting element in the light emitting element layer EML when pressure is applied to the display device 10. In an embodiment, the spacer SPC changes an optical path.

In some embodiments, the spacer SPC includes an organic insulating material such as polyimide. Alternatively, in some embodiments, the spacer SPC includes an inorganic insulating material, or includes an organic insulating material and an inorganic insulating material.

In some embodiments, the spacer SPC includes a material that differs from that of the bank 180, or includes the same material as that of the bank 180. When the spacer SPC and the bank 180 include the same material, the bank 180 and the spacer SPC are formed together in a mask process that uses a halftone mask. In some embodiments, the bank 180 and the spacer SPC include polyimide.

The first light emitting layer 172 is disposed on the first pixel electrode 171. The first light emitting layer 172 includes an organic material that emits light of a predetermined color. For example, the first light emitting layer 172 includes a hole transporting layer, an organic material layer, and an electron transporting layer. The organic material layer includes a host and a dopant. The organic material layer includes a material that emits light of a predetermined color, and is formed using a phosphorescent material or a fluorescent material.

The first common electrode 173 is disposed on the first light emitting layer 172, the bank 180 and the spacer SPC. The first common electrode 173 covers the first light emitting layer 172. The first common electrode 173 is commonly formed on the display pixels, and further covers the bank 180 and the spacer SPC.

In a top emission structure, the first common electrode 173 includes a transparent conductive material (TCO) such as ITO or IZO, or a semi-transmissive conductive material such as magnesium (Mg), silver (Ag) or an alloy of magnesium (Mg) and silver (Ag). When the first common electrode 173 is formed of a semi-transmissive conductive material, light output efficiency is enhanced by a micro cavity.

The encapsulation layer TFEL is formed on the light emitting element layer EML. The encapsulation layer TFEL includes at least one inorganic layer that prevents oxygen or water from permeating into the light emitting element layer EML. The encapsulation layer TFEL also includes at least one organic layer that protects the light emitting element layer EML from particles.

For example, the thin film encapsulation layer TFEL includes a first inorganic encapsulation layer 191 disposed on the first common electrode 173, an organic encapsulation layer 192 disposed on the first inorganic encapsulation layer 191, and a second inorganic encapsulation layer 193 disposed on the organic encapsulation layer 192. The first inorganic encapsulation layer 191 and the second inorganic encapsulation layer 193 each include multiple layers in which one or more inorganic layers of a silicon nitride layer, a silicon oxynitride layer, a silicon oxide layer, a titanium oxide layer or an aluminum oxide layer are alternately stacked. The organic layer includes at least one of an acrylic resin, an epoxy resin, a phenolic resin, a polyamide resin or a polyimide resin.

The sensor electrode layer SEN is disposed on the encapsulation layer TFEL. The sensor electrode layer SEN includes driving electrodes TE, sensing electrodes RE and touch connection electrodes BE, as described above.

A first touch insulating layer TINS1 is disposed on the encapsulation layer TFEL. In some embodiments, the first touch insulating layer TINS1 is formed of an inorganic insulating layer such as a silicon nitride layer, a silicon oxynitride layer, a silicon oxide layer, a titanium oxide layer or an aluminum oxide layer.

The touch connection electrodes BE are disposed on the first touch insulating layer TINS1. The touch connection electrodes BE may be formed of a single layer of molybdenum (Mo), titanium (Ti), copper (Cu), or aluminum (Al), or may be formed of a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO.

A second touch insulating layer TINS2 is disposed on the touch connection electrodes BE and the first touch insulating layer TINS1. In some embodiments, the second touch insulating layer TINS2 is formed of an inorganic insulating layer such as a silicon nitride layer, a silicon oxynitride layer, a silicon oxide layer, a titanium oxide layer or an aluminum oxide layer.

The driving electrodes TE and the sensing electrodes RE are disposed on the second touch insulating layer TINS2. Since light emitted from the light emission areas EA1, EA2, EA3 and EA4 is shielded by the driving electrodes TE and the sensing electrodes RE, to prevent light luminance from being reduced, the driving electrodes TE and the sensing electrodes RE do not overlap the light emission areas EA1, EA2, EA3 and EA4. The driving electrodes TE and the sensing electrodes RE may be formed of a single layer of molybdenum (Mo), titanium (Ti), copper (Cu) or aluminum (Al), or may be formed of a stacked structure (Ti/Al/Ti) of aluminum and titanium, a stacked structure (ITO/Al/ITO) of aluminum and ITO, an APC alloy, or a stacked structure (ITO/APC/ITO) of APC alloy and ITO.

A third touch insulating layer TINS3 is disposed on the driving electrodes TE, the sensing electrodes RE and the second touch insulating layer TINS2. In some embodiments, the third touch insulating layer TINS3 includes an organic insulating material such as one of an acrylic resin, an epoxy resin, a phenolic resin, a polyamide resin or a polyimide resin.

Figure 7:
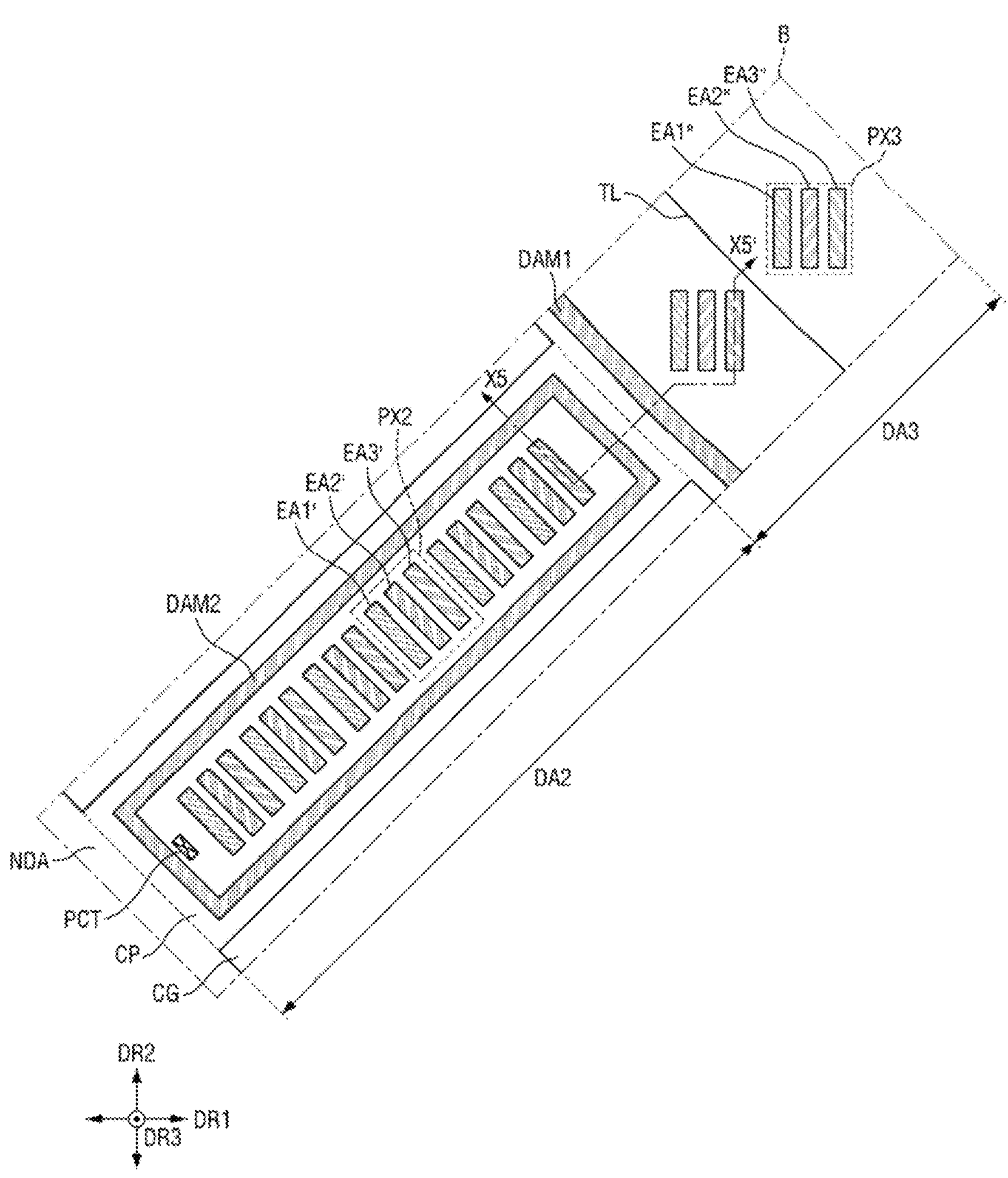
FIG. 7 is a schematic plan view of an area B of FIG. 4.
Figure 8:
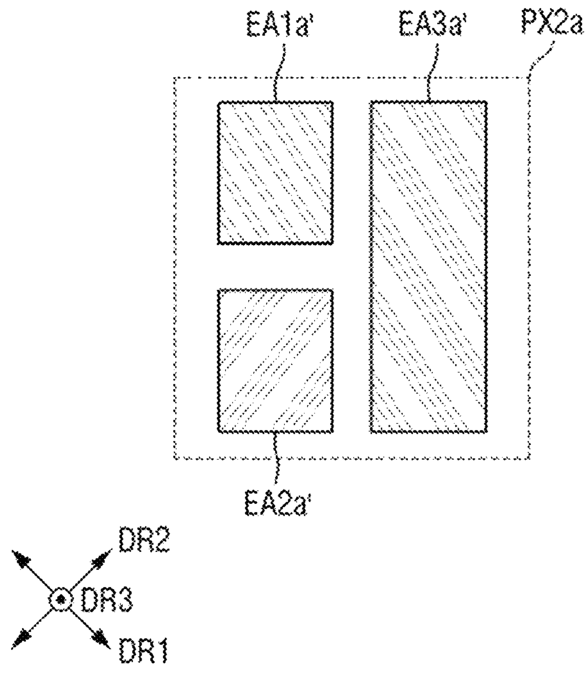
FIG. 8 is a plan view of a modified example of a second pixel shown in FIG. 7.
Figure 9:
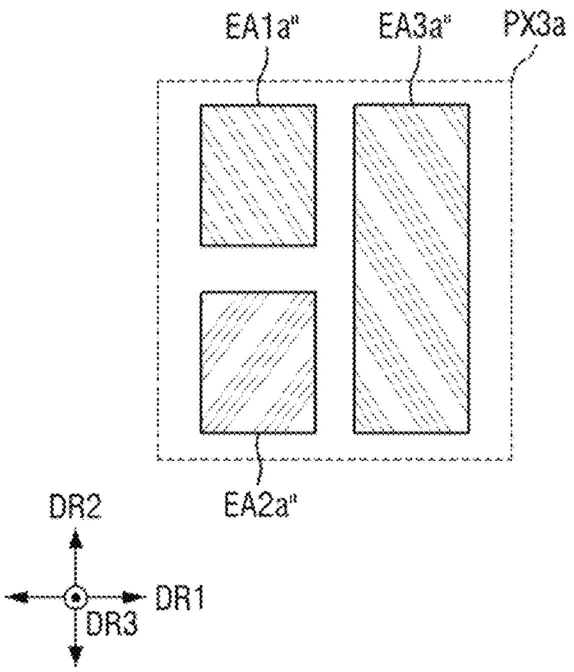
FIG. 9 is a plan view of a modified example of a third pixel shown in FIG. 7.
Figure 10:
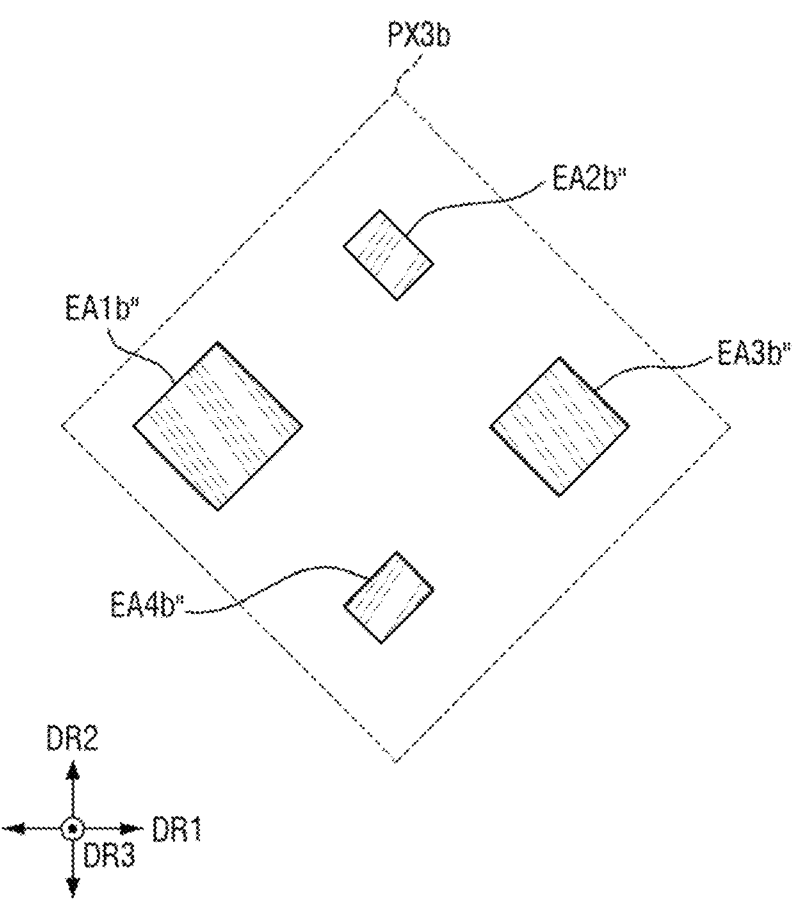
FIG. 10 is a plan view of another modified example of a third pixel shown in FIG. 7.

FIG. 7 is a schematic plan view of an area B of FIG. 4, FIG. 8 is a plan view of a modified example of a second pixel shown in FIG. 7, FIG. 9 is a plan view of a modified example of a third pixel shown in FIG. 7, and FIG. 10 is a plan view of another modified example of a third pixel shown in FIG. 7.

Referring to FIGS. 7 to 10, in an embodiment, the second display area DA2 of the first corner portion CS1 includes a plurality of cut-out patterns CP and cut-output portions CG as shown in FIG. 7.

Each of the cut-out patterns CP includes the second pixel PX2, a second dam DAM2 and a power contact hole PCT.

The second pixels PX2 are arranged in one direction. Each of the second pixels PX2 includes a plurality of light emission areas EA1', EA2' and EA3'. In some embodiments, the number of the light emission areas EA1', EA2' and EA3' of each of the second pixels PX2 differs from the number of the light emission areas EA1, EA2, EA3 and EA4 of each of the first pixels PX1 of FIG. 5. In some embodiments, the number of the light emission areas EA1', EA2' and EA3' of each of the second pixels PX2 is the same as the number of light emission areas EA1", EA2" and EA3" of each of the third pixels PX3, but embodiments are not necessarily limited thereto. In some embodiments, the number of the light emission areas EA1', EA2' and EA3' of each of the second pixels PX2 differs from the number of light emission areas EA1", EA2" and EA3" of each of the third pixels PX3.

For example, each of the second pixels PX2 includes a first light emission area EA1', a second light emission area EA2' and a third light emission area EA3'. For example, the first light emission area EA1' refers to a light emission area of a first subpixel that emits first light, the second light emission area EA2' refers to a light emission area of a second subpixel that emits second light, and the third light emission area EA3' refers to a light emission area of a third subpixel that emits third light.

The first light emission area EA1', the second light emission area EA2' and the third light emission area EA3' emit light of different colors. For example, the first light emission area EA1' emits red light, the second light emission area EA2' emits green light, and the third light emission area EA3' emits blue light.

In some embodiments, the first light emission area EA1', the second light emission area EA2' and the third light emission area EA3' are sequentially arranged along one direction. Each of the first light emission area EA1', the second light emission area EA2' and the third light emission area EA3' has a rectangular planar shape. For example, each of the first light emission area EA1', the second light emission area EA2' and the third light emission area EA3' has a rectangular planar shape with a short side and a long side, but embodiments of the present disclosure are not necessarily limited thereto. In other embodiments, each of the first light emission area EA1', the second light emission area EA2' and the third light emission area EA3' has other shapes, such as a polygonal, circular or oval planar shape in addition to the rectangular planar shape. In addition, although FIG. 7 illustrates that the first light emission area EA1', the second light emission area EA2' and the third light emission area EA3' have substantially the same size, embodiments of the present disclosure are not necessarily limited thereto. In an embodiment, least one of the first light emission area EA1', the second light emission area EA2' or the third light emission area EA3' has a size that differs from that of the other areas.

For example, the second pixel PX2 shown in FIG. 7 can be modified to a structure of a second pixel PX2*a* shown in FIG. 8. In detail, a third light emission area EA3*a*' has a rectangular planar shape that has a short side and a long side, and both a first light emission area EA1*a*' and a second light emission area EA2a' face one side of the third light emission area EA3a'. The first light emission area EA1a' and the second light emission area EA2a' are adjacent to each other. In this case, a size of the third light emission area EA3a' is greater than that of the first light emission area EA1a' and that of the second light emission area EA2a'. In some embodiments, the first light emission area EA1a' emits red light, the second light emission area EA2a' emits green light, and the third light emission area EA3a' emits blue light.

Referring back to FIG. 7, the second dam DAM2 surrounds the second pixels PX2. The second dam DAM2 is disposed at edges of each of the cut-out patterns CP. In some embodiments, the second dam DAM2 forms a closed loop on a plane.

In some embodiments, the power contact hole PCT is disposed in an area surrounded by the second dam DAM2. FIG. 7 illustrates that the power contact hole PCT is disposed at one side edge of the cut-out pattern CP between the second dam DAM2 and the second pixel PX2, but embodiments are not necessarily limited thereto. The power contact hole PCT is where a power voltage or a power line through which a common voltage is provided and a second common electrode of the second pixel PX2 are connected. 100135J A plurality of third pixels PX3 are disposed in the third display area DA3 of the first corner portion CS1.

In some embodiments, each of the third pixels PX3 includes a plurality of light emission areas EA1", EA2" and EA3". In some embodiments, the number of the light emission areas EA1", EA2" and EA3" of each of the third pixels PX3 differs from the number of the light emission areas EA1, EA2, EA3 and EA4 of each of the first pixels PX1.

For example, each of the third pixels PX3 includes a first light emission area EA1", a second light emission area EA2" and a third light emission area EA3". For example, the first light emission area EA1" refers to a light emission area of a first subpixel that emits first light, the second light emission area EA2" refers to a light emission area of a second subpixel that emits second light, and the third light emission area EA3" refers to a light emission area of a third subpixel that emits third light.

The first light emission area EA1", the second light emission area EA2" and the third light emission area EA3" emit light of different colors. For example, the first light emission area EA1" emits red light, the second light emission area EA2" emits green light, and the third light emission area EA3" emits blue light.

In some embodiments, the first light emission area EA1", the second light emission area EA2" and the third light emission area EA3" are arranged in the first direction DR1.

In some embodiments, a planar shape of each of the first light emission area EA1", the second light emission area EA2" and the third light emission area EA3" of the third pixels PX3 differs from that of each of the light emission areas EA1, EA2, EA3 and EA4 of the first pixels PX1. For example, each of the first light emission area EA1", the second light emission area EA2" and the third light emission area EA3" has a rectangular planar shape. Each of the first light emission area EA1", the second light emission area EA2" and the third light emission area EA3" has a rectangular planar shape with a short side in the first direction DR1 and a long side in the second direction DR2.

However, the planar shape of each of the first light emission area EA1", the second light emission area EA2" and the third light emission area EA3" is not necessarily limited to a rectangular planar shape. In other embodiments, each of the first light emission area EA1", the second light emission area EA2" and the third light emission area EA3" has another shape, such as a polygonal, circular or oval planar shape in addition to a rectangular planar shape. In addition, although FIG. 7 illustrates that the first light emission area EA1", the second light emission area EA2" and the third light emission area EA3" have substantially the same size, embodiments of the present disclosure are not necessarily limited thereto. In an embodiment, at least one of the first light emission area EA1", the second light emission area EA2" and the third light emission area EA3" has a size that differs from that of the other areas.

For example, the third pixel PX3 shown in FIG. 7 can be modified to a structure of a third pixel PX3a shown in FIG. 9. For example, a third light emission area EA3a" has a rectangular planar shape that has a short side and a long side, and both a first light emission area EA1a" and a second light emission area EA2a" face one side of the third light emission area EA3a". The first light emission area EA1a" and the second light emission area EA2a" are adjacent to each other along the second direction DR2.

FIG. 9 shows that the size of the third light emission area EA3a" is greater than that of the first light emission area EA1a" and that of the second light emission area EA2a", however, embodiments of the present disclosure are not necessarily limited thereto. In some embodiments, the size of the third light emission area EA3a" less than that of the first light emission area EA1a" and that of the second light emission area EA2a". In addition, in an embodiment, the size of the first light emission area EA1a" and the size of the second light emission area EA2a" are the same as each other, but in an embodiment, the size of the second light emission area EA2a" is greater than that of the first light emission area EA1a".

In some embodiments, the first light emission area EA1a" emits red light, the second light emission area EA2a" emits green light, and the third light emission area EA3a" emits blue light, but embodiments of the present disclosure are not necessarily limited thereto. In some embodiments, the first light emission area EA1a" emits red light, the second light emission area EA2a" emits blue light, and the third light emission area EA3a" emits green light.

Alternatively, in an embodiment, the third pixel PX3 shown in FIG. 7 can be modified to a structure of a third pixel PX3b shown in FIG. 10. The third pixel PX3b includes a first light emission area EA1b", a second light emission area EA2b", a third light emission area EA3b" and a fourth light emission area EA4b". For example, in some embodiments, the third pixel PX3b has a structure substantially the same as that of the first pixel PX1 of FIG. 5. Since the first light emission area EA1b", the second light emission area EA2b", the third light emission area EA3b" and the fourth light emission area EA4b" are substantially the same as the first light emission area EA1 of FIG. 5, the second light emission area EA2 of FIG. 5, the third light emission area EA3 of FIG. 5 and the fourth light emission area EA4 of FIG. 5, a repeated detailed description will be omitted.

Referring back to FIG. 7, in some embodiments, a touch line TL is disposed between adjacent third pixels PX. In some embodiments, the touch line TL is a touch driving line connected to the driving electrodes TE of FIG. 6, or a touch sensing line connected to the sense electrodes RE of FIG. 6.

In some embodiments, the touch line TL does not overlap the first light emission area EA1", the second light emission area EA2" and the third light emission area EA3". Therefore, light emitted from the light emission areas EA1", EA2" and EA3" is not shielded by the touch lines TL.

A first dam DAM1 is disposed at an edge of the third display area DA3 adjacent to the second display area DA2. In some embodiments, the first dam DAM1 is adjacent to the cut-out pattern CP. The first dam DAM1 prevents the organic encapsulation layer of the encapsulation layer TFEL disposed in the third display area DA3 from overflowing.

Figure 11:
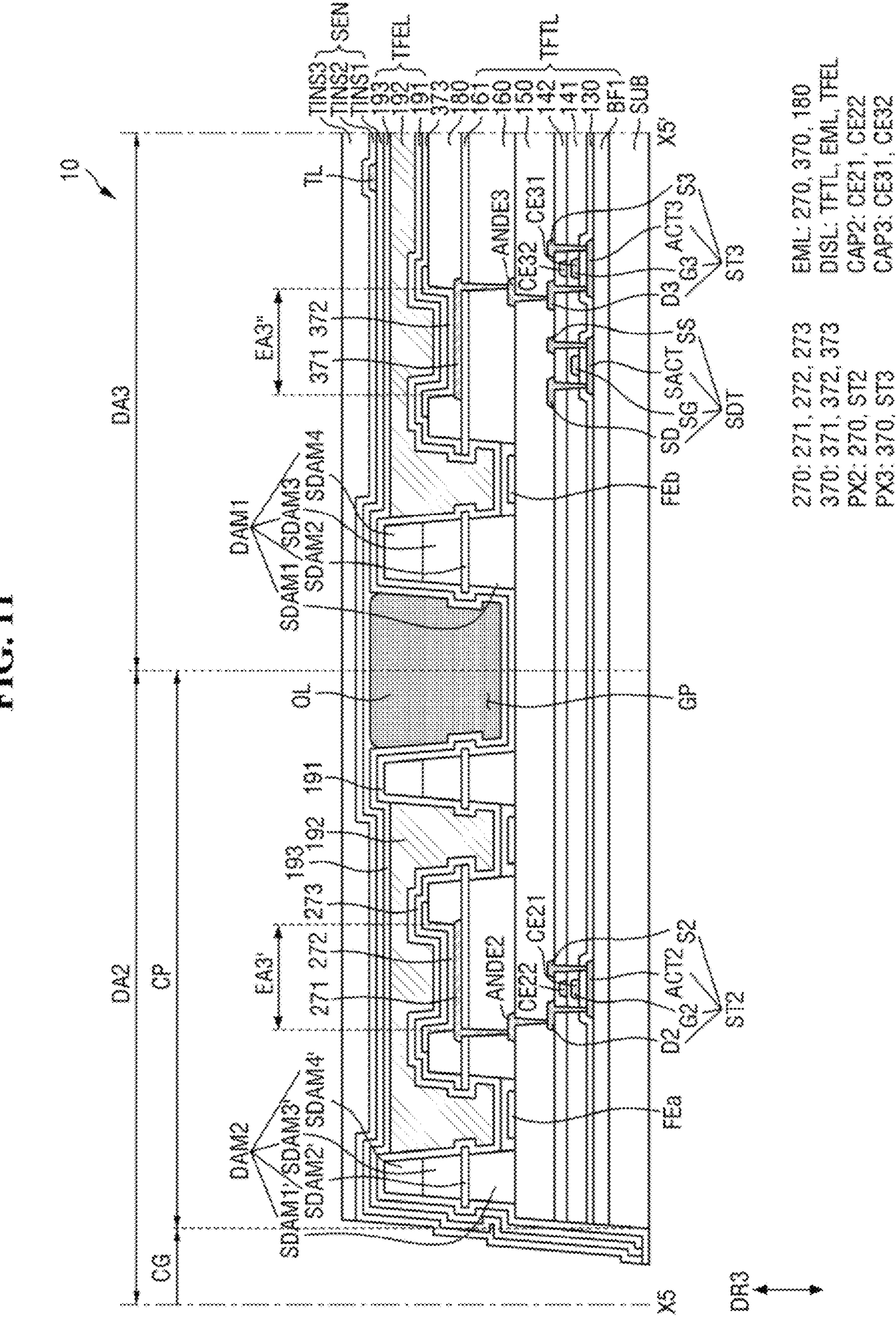
FIG. 11 is a schematic cross-sectional view of a display device taken along line X5-X5' of FIG. 7.
Figure 12:
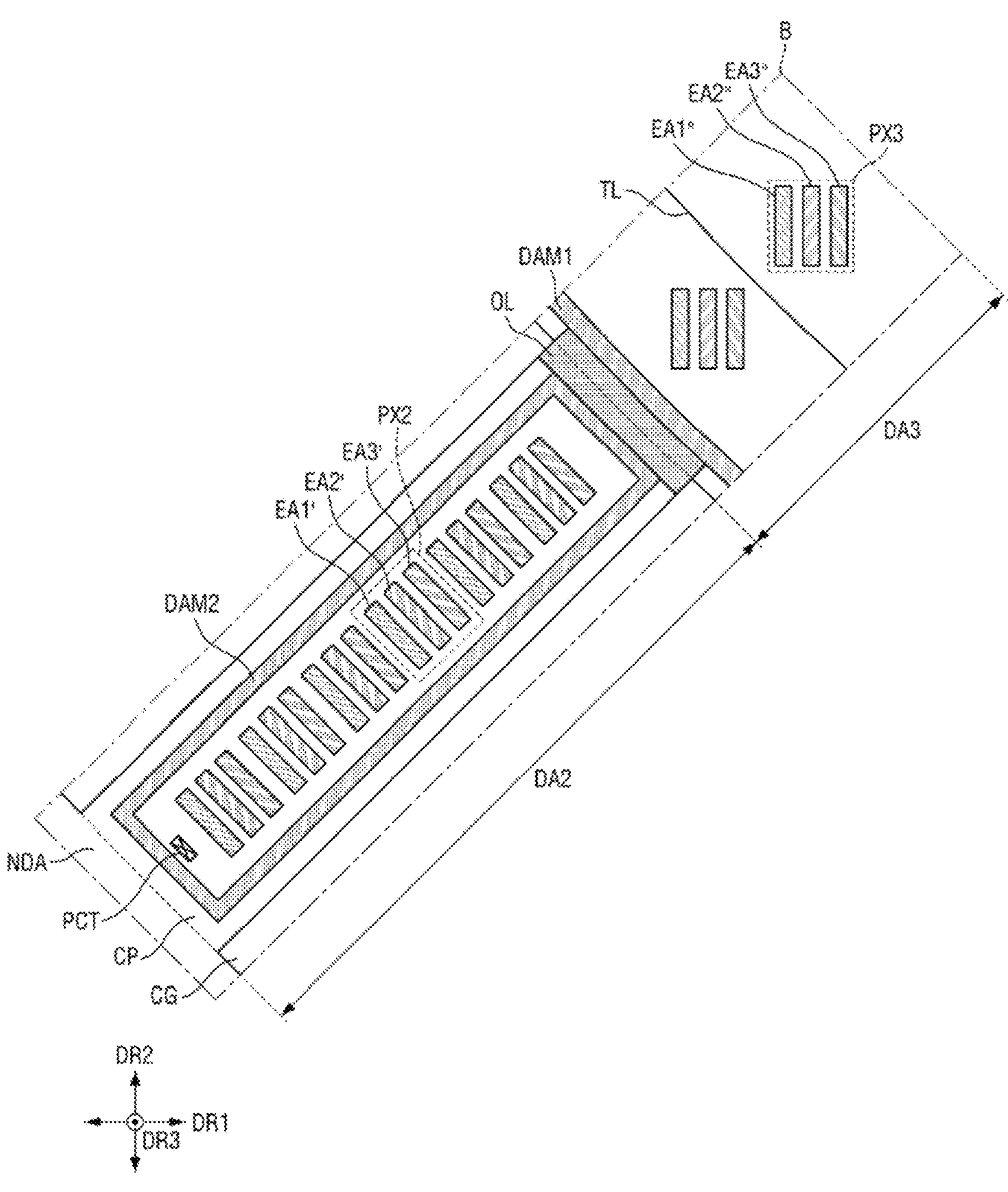
FIG. 12 is a schematic plan view of area B of FIG. 4, showing the organic passivation layer of FIG. 11.
Figure 13:
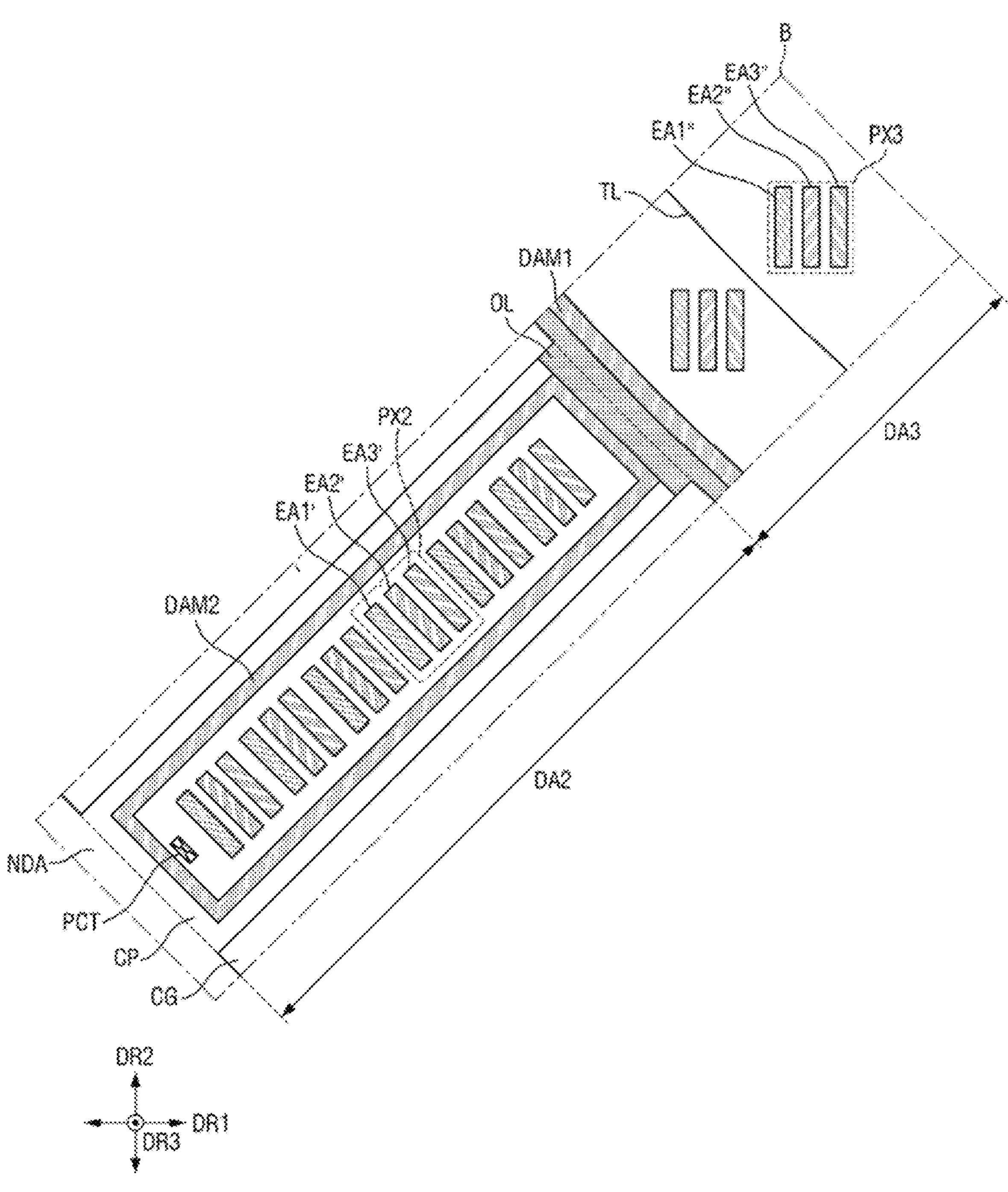
FIG. 13 is a schematic plan view of area B of FIG. 4, showing a modified organic passivation layer of FIG. 11

FIG. 11 is a schematic cross-sectional view of a display device taken along line X5-X5' of FIG. 7, FIG. 12 is a schematic plan view of area B of FIG. 4, showing the organic passivation layer of FIG. 11, and FIG. 13 is a schematic plan view of area B of FIG. 4, showing a modified organic passivation layer of FIG. 11.

FIG. 11 is a cross-section of a display panel of a display device, and a cross-section of the cut-out pattern and the cut-out portion of the second display area DA2 and a cross-section of a portion of the third display area DA3 are shown in FIG. 11.

Referring to FIGS. 7 and 11 to 13, in an embodiment, the second display area DA2 includes a cut-out pattern CP and a cut-out pattern CG.

In the cut-out portion CG, at least a portion of the thin film transistor layer TFTL is removed by laser. For example, the buffer layer BF1, the gate insulating layer 130, the first interlayer insulating layer 141, the second interlayer insulating layer 142, the first insulating layer 150, the second insulating layer 160 and the barrier layer 161 are not disposed in each of the cut-out portions CG. In addition, the bank 180 is not disposed in each of the cut-out portions CG.

In some embodiments, the substrate SUB is partially removed in the cut-out portion CG.

In some embodiments, the first inorganic encapsulation layer 191 and the second inorganic encapsulation layer 193 are disposed in the cut-out portion CG. In some embodiments, the first inorganic encapsulation layer 191 surrounds the side of the substrate in the cut-out portion CG, and the second inorganic encapsulation layer 193 is disposed on the first inorganic encapsulation layer 191 in the cut-out portion CG.

The first inorganic encapsulation layer 191 surrounds a side of the substrate SUB to prevent external water or oxygen from permeating into the thin film transistor layer TFTL through the cut-out portion CG. In addition, the second inorganic encapsulation layer 193 directly contacts the first inorganic encapsulation layer 191 in the cut-out portion CG to form an inorganic-inorganic junction. Therefore, the second inorganic encapsulation layer 193 prevents external water or oxygen from permeating into the light emitting element layer EML.

In some embodiments, the first touch insulating layer TINS1 and the second touch insulating layer TINS2 are further disposed in the cut-out portion CG. In some embodiments, in the cut-out portion CG, the first touch insulating layer TINS1 is disposed on the second inorganic encapsulation layer 193 and the second touch insulating layer TINS2 is disposed on the first touch insulating layer TINS1. In some embodiments, when the first touch insulating layer TINS1 and the second touch insulating layer TINS2 include an inorganic insulating material, in the cut-out portion CG, the first touch insulating layer TINS1 is in contact with the second inorganic encapsulation layer 193 to form an inorganic-inorganic junction, and the second touch insulating layer TINS2 is in contact with the first touch insulating layer TINS1 to form an inorganic-inorganic junction. Therefore, permeation of external water or oxygen is effectively prevented.

In the cut portion CG, at least a portion of the thin film transistor layer TFTL is removed, and a portion of the substrate SUB is removed. Therefore, the cut-out portion CG is more elongated than the cut-out pattern CP. Therefore, the cut-out portions CG of the second display area DA2 are elongated by a double curvature of the first corner portion CS1, and an interval between the cut-out portions CG is widened. Therefore, strain applied to the second display area DA2 is reduced, and thus reliability of the display device 10 is increased due to the reduced strain applied to the second display area DA2, and at the same time the second display area DA2 can be implemented in the first corner portion CS1 to enlarge the total size of the display area.

The substrate SUB, the thin film transistor layer TFTL, the light emitting element layer EML, and the encapsulation layer TFEL are disposed in each of the cut-out patterns CP.

The thin film transistor layer TFTL is disposed on the substrate SUB in the second display area DA2, and the thin film transistor layer TFTL further includes a second thin film transistor ST2, a second storage capacitor CAP2, and a pixel connection electrode ANDE2.

The second thin film transistor ST2 includes a second active layer ACT2, a second gate electrode G2, a second source electrode S2, and a second drain electrode D2. The elements of the second thin film transistor ST2 are substantially the same as the first active layer ACT1 of FIG. 6, the first gate electrode G1 of FIG. 6, the first source electrode S1 of FIG. 6, and the first drain electrode D1 of FIG. 6. In addition, the second storage capacitor CAP2 includes a first capacitor electrode CE21 and a second capacitor electrode CE22, and the elements of the second storage capacitor CAP2 are substantially the same as the first storage capacitor CAP1 of FIG. 6. Similarly, the pixel connection electrode ANDE2 is substantially the same as the pixel connection electrode ANDE1 of FIG. 6. Therefore, a repeated detailed description of the second thin film transistor ST2, the second storage capacitor CAP2, and the pixel connection electrode ANDE2 will be omitted.

The light emitting element layer EML is disposed on the thin film transistor layer TFEL in the second display area DA2. The light emitting element layer EML further includes a second light emitting element 270 disposed in the second display area DA2. The second light emitting element 270 includes a second pixel electrode 271, a second light emitting layer 272, and a second common electrode 273.

In some embodiments, the second common electrode 273 is spaced apart from the first common electrode 173 of FIG. 6. For example, the first common electrode 173 of FIG. 6 and the second common electrode 273 may be physically connected to each other, or may be separated from each other without being integrated with each other.

The second pixel electrode 271 is electrically connected to the second drain electrode D2 of the second thin film transistor ST2 through the pixel connection electrode ANDE2. Since the second pixel electrode 271, the second light emitting layer 272, and the second common electrode 273 of the second light emitting element 270, are substantially the same as the first pixel electrode 171 of FIG. 6, the first light emitting layer 172 of FIG. 6, and the first common electrode 173 of FIG. 6, a repeated detailed description will be omitted.

The second dam DAM2 is disposed on the substrate SUB in the second display area DA2. The second dam DAM2 is disposed along the edge of each cut-out pattern CP as described above, and has a closed loop shape on a plane. The closed loop shape of the second dam DAM2 partitions a space therein, and the second light emitting element 270 is disposed in the partitioned space. That is, the second light emitting element 270 is completely surrounded by the second dam DAM2.

In some embodiments, the second dam DAM2 is disposed on the first insulating layer 150.

In some embodiments, the second dam DAM2 includes a first sub dam SDAM1' disposed on the first insulating layer 150, a second sub dam SDAM2' disposed on the first sub dam SDAM1', a third sub dam SDAM3' disposed on the second sub dam SDAM2', and a fourth sub dam SDAM4' disposed on the third sub dam SDAM3'.

In some embodiments, the first sub dam SDAM1' is formed of the same material as the second insulating layer 160 and is simultaneously formed through the same process as the second insulating layer 160. The second sub dam SDAM2' is formed of the same material as the barrier layer 161 and is simultaneously formed with the barrier layer 161 in the same process as the barrier layer 161. The third sub dam SDAM3' is formed of the same material as the bank 180 and is simultaneously formed with the bank 180 in the same process as the bank 180. The fourth sub dam SDAM4' is formed of the same material as the spacer SPC of FIG. 6 and is simultaneously formed with the spacer SPC of FIG. 6 in the same process as the spacer SPC of FIG. 6.

In some embodiments, the second dam DAM2 has an undercut structure. For example, a width of the second sub dam SDAM2' is greater than that of an upper surface of the first sub dam SDAM1', which is in contact with the second sub dam SDAM2', so that an undercut is formed below an end portion of the second sub dam SDAM2'. Since the second dam DAM2 has an undercut structure, a portion of the second common electrode 273 is disconnected due to the undercut structure of the second dam DAM2 in the process of forming the second common electrode 273 even though a separate mask is not used.

For example, since the second dam DAM2 has an undercut structure, the second common electrode 273 is disconnected from the periphery of the second dam DAM2. Therefore, in some embodiments, a floating pattern FEa, which is a residual layer of the second common electrode 273, is disposed on the first insulating layer 150 adjacent to the second dam DAM2.

In the second display area DA2, the encapsulation layer TFEL is disposed on the light emitting element layer EML. The encapsulation layer TFEL covers the second dam DAM2 as well as the light emitting element layer EML.

In some embodiments, the first inorganic encapsulation layer 191 covers the light emitting element layer EML and the second dam DAM2 in the second display area DA2. As described above, an end portion of the first inorganic encapsulation layer 191 extends into the cut-out portion CG and covers the side of the substrate SUB and the exposed side of the thin film transistor layer TFTL in the cut-out portion CG.

The organic encapsulation layer 192 is disposed on the first inorganic encapsulation layer 191 in the second display area DA2. The organic encapsulation layer 192 is disposed in the space partitioned by the second dam DAM2. In some embodiments, a portion of the organic encapsulation layer 192 disposed in the second display area DA2 is spaced apart from a portion of the organic encapsulation layer 192 disposed in the third display area DA3 and a portion of the organic encapsulation layer 192 disposed in the first display area.

The second inorganic encapsulation layer 193 is disposed on the organic encapsulation layer 192 in the second display area DA2. The second inorganic encapsulation layer 193 covers the light emitting element layer EML, the organic encapsulation layer 192 and the second dam DAM2.

In some embodiments, a portion of the first inorganic encapsulation layer 191 disposed in the second display area DA2, a portion of the first inorganic encapsulation layer 191 disposed in the third display area DA3, and a portion of the first inorganic encapsulation layer 191 disposed in the first display area are integrally formed with one another. In addition, a portion of the second inorganic encapsulation layer 193 disposed in the second display area DA2, a portion of the second inorganic encapsulation layer 193 disposed in the third display area DA3, and a portion of the second inorganic encapsulation layer 193 disposed in the first display area are integrally formed with one another.

As described above, the third pixels PX3 and a touch line TL are disposed in the third display area DA3, and a portion of a scan driver, such as a scan driving transistor SDT included in the scan driver, are disposed in the third display area DA3.

The thin film transistor layer TFTL is disposed on the substrate SUB in the third display area DA3, and the thin film transistor layer TFTL further includes a third thin film transistor ST3, a third storage capacitor CAPs, a scan driving transistor SDT and a pixel connection electrode ANDE3, which are disposed in the third display area DA3.

The third thin film transistor ST3 includes a third active layer ACT3, a third gate electrode G3, a third source electrode S3, and a third drain electrode D3. Since elements of the third thin film transistor ST3 are substantially the same as the first active layer ACT1 of FIG. 6, the first gate electrode G1 of FIG. 6, the first source electrode S1 of FIG. 6, and the first drain electrode D1 of FIG. 6, a repeated detailed description will be omitted.

The scan driving transistor SDT of the scan driver includes a scan active layer SACT, a scan gate electrode SG, a scan source electrode SS and a scan drain electrode SD. Since the scan active layer SACT, the scan gate electrode SG, the scan source electrode SS and the scan drain electrode SD of the scan driving transistor SDT are substantially the same as the first active layer ACT1 of FIG. 6, the first gate electrode G1 of FIG. 6, the first source electrode S1 of FIG. 6 and the first drain electrode D1 of FIG. 6 of the first thin film transistor ST1, a repeated detailed description will be omitted.

The scan driving transistor SDT is disposed in the thin film transistor layer TFTL along with the third thin film transistors ST3 that drives the third light emitting element 370 in each light emission area of the third pixels PX3. Therefore, the scan driving transistor SDT is disposed in an area in which the third thin film transistors ST3 are not disposed, to avoid the third thin film transistors ST3.

In some embodiments, the scan driving transistor SDT is relatively more adjacent to the second display area DA2 than the third thin film transistor ST3. In some embodiments, at least a portion of the scan driving transistor SDT overlaps a third light emitting element 370 that will be described below.

The Third storage capacitor CAP3 includes a first capacitor electrode CE31 and a second capacitor electrode CE32, and the elements of the second storage capacitor CAP3 are substantially the same as the first storage capacitor CAP1 of FIG. 6. Similarly, the pixel connection electrode ANDE3 is substantially the same as the pixel connection electrode ANDE1 of FIG. 6. Therefore, a repeated detailed description of the third storage capacitor CAP2, and the pixel connection electrode ANDE3 will be omitted.

The light emitting element layer EML is disposed on the thin film transistor layer TFEL in the third display area DA3.

The light emitting element layer EML further includes a third light emitting element 370 disposed in the third display area DA3. The third light emitting element 370 include a third pixel electrode 371, a third light emitting layer 372, and a third common electrode 373.

The third pixel electrode 371 is electrically connected to the third drain electrode D3 of the third thin film transistor ST3 through the pixel connection electrode ANDE3.

In some embodiments, the third common electrode 373 is integrally formed with the first common electrode 173 of FIG. 6, and is spaced apart from the second common electrode 273.

Since the third pixel electrode 371, the third light emitting layer 372, and the third common electrode 373 are substantially the same as the first pixel electrode 171 of FIG. 6, the first light emitting layer 172 of FIG. 6, and the first common electrode 173 of FIG. 6, a repeated detailed description will be omitted.

Although the third pixel electrode 371 of the third light emitting element 370 and the third thin film transistor ST3 are shown as partially overlapping each other, in embodiment, the third pixel electrode 371 and the third thin film transistor ST3 do not overlap each other.

The first dam DAM1 is disposed on the substrate SUB in the third display area DA3. The first dam DAM1 is adjacent to the second display area DA2 in the third display area DA3 as described above.

In some embodiments, the first dam DAM1 includes a first sub dam SDAM1 disposed on the first insulating layer 150, a second sub dam SDAM2 disposed on the first sub dam SDAM1, a third sub dam SDAM3 disposed on the second sub dam SDAM2, and a fourth sub dam SDAM4 disposed on the third sub dam SDAM3.

In some embodiments, the first sub dam SDAM1 is formed of the same material as the second insulating layer 160 and is simultaneously formed through the same process as the second insulating layer 160. The second sub dam SDAM2 is formed of the same material as the barrier layer 161 and is simultaneously formed with the barrier layer 161 in the same process as the barrier layer 161. The third sub dam SDAM3 is formed of the same material as the bank 180 and is simultaneously formed with the bank 180 in the same process as the bank 180. The fourth sub dam SDAM4 is formed of the same material as the spacer SPC of FIG. 6 and is simultaneously formed with the spacer SPC of FIG. 6 in the same process as the spacer SPC of FIG. 6.

In some embodiments, the first dam DAM1 has an undercut structure. For example, a width of the second sub dam SDAM2 is greater than that of an upper surface of the first sub dam SDAM1 that is in contact with the second sub dam SDAM2, so that an undercut is formed below an end portion of the second sub dam SDAM2.

In some embodiments, since the first dam DAM1 has an undercut structure, the third common electrode 373 is disconnected in the periphery of the first dam DAM1. Therefore, in some embodiments, a floating pattern FEb, which is a residual layer of the third common electrode 373, is disposed on the first insulating layer 150 in the vicinity of the first dam DAM1.

A gap space GP is formed between portions that face the first dam DAM1 and the second dam DAM2.

In the third display area DA3, the encapsulation layer TFEL is disposed on the light emitting element layer EML. The encapsulation layer TFEL covers the light emitting element layer EML and the first dam DAM1.

In embodiments, the first inorganic encapsulation layer 191 covers the light emitting element layer EML and the first dam DAM1 in the third display area DA3.

The organic encapsulation layer 192 is disposed on the first inorganic encapsulation layer 191 in the third display area DA3. In some embodiments, a portion of the organic encapsulation layer 192 disposed in the third display area DA3 is integrally formed with a portion of the organic encapsulation layer 192 disposed in the first display area DA1, and is spaced apart from a portion of the organic encapsulation layer 192 disposed in the second display area DA2.

The second inorganic encapsulation layer 193 is disposed on the organic encapsulation layer 192 in the third display area DA3. The second inorganic encapsulation layer 193 covers the light emitting element layer EML, the organic encapsulation layer 192 and the first dam DAM1.

In some embodiments, the first inorganic encapsulation layer 191 and the second inorganic encapsulation layer 193 directly contacts each other within the gap space GP between the first dam DAM1 and the second dam DAM2. The first inorganic encapsulation layer 191 and the second inorganic encapsulation layer 193 in contact with each other between the first dam DAM1 and the second dam DAM2 form an inorganic-inorganic junction.

An organic passivation layer OL is disposed between the first dam DAM1 and the second dam DAM2. In some embodiments, the organic passivation layer OL is disposed in both the second display area DA2 and the third display area DA3, and fills the gap space GP between the first dam DAM1 and the second dam DAM2.

In some embodiments, the organic passivation layer OL is disposed at the edge of the third display area DA3, which faces the second display area DA2 or the cut-out pattern CP, and at the edge of the second display area DA2, which faces the third display area DA3, as shown in FIG. 12.

In some embodiments, the organic passivation layer OL is not disposed on the edge of the third display area DA3, which faces the cut-out portion CG.

In some embodiments, the organic passivation layer OL has a width that corresponds to one side of a portion of the cut-out pattern CP, which is in contact with the third display area DA3.

In an embodiment, as shown in FIG. 13, the organic passivation layer OL is disposed at the edge of the third display area DA3 that faces the second display area DA2 or the cut-out pattern CP, at the edge of the second display area DA2 that faces the third display area DA3, and at the edge of the third display area DA3 that faces the cut-out portion CG.

In some embodiments, the organic passivation layer OL is disposed on the encapsulation layer TFEL as shown in FIG. 11, and directly contacts the encapsulation layer TFEL. For example, the organic passivation layer OL is disposed on the second inorganic encapsulation layer 193, and directly contacts the second inorganic encapsulation layer 193.

In some embodiments, the organic passivation layer OL mitigates a step difference between the sensing electrode layer SEN and the encapsulation layer TFEL that is generated by the gap space GP between the first dam DAM1 and the second dam DAM2.

In some embodiments, the organic passivation layer OL includes an organic insulating material such as one of polyimide, epoxy resin, acrylic resin, polyester-based resin, polyacrylic resin, polyimide-based resin, polyamide-based resin, or siloxane-based resin.

The organic passivation layer OL prevents cracks from occurring in the first inorganic encapsulation layer 191 and the second inorganic encapsulation layer 193.

When the second display area DA2 or the cut-out pattern CP is bent with a predetermined curvature, strain or stress is applied to the first inorganic encapsulation layer 191 and the second inorganic encapsulation layer 193 disposed between the first dam DAM1 and the second dam DAM2 or in the gap space GP. A crack can occur in the first inorganic encapsulation layer 191 or the second inorganic encapsulation layer 193 due to the strain or stress. When the crack occurs in the first inorganic encapsulation layer 191 or the second inorganic encapsulation layer 193, external water or oxygen can permeate through the crack, decreasing reliability of the display device 10.

According to embodiments, an organic passivation layer OL is disposed between the first dam DAM1 and the second dam DAM2, and the organic passivation layer OL is disposed on the second inorganic encapsulation layer 193. Therefore, stress applied to the first inorganic encapsulation layer 191 and the second inorganic encapsulation layer 193 is reduced by raising a neutral surface between the first dam DAM1 and the second dam DAM2, and cracks can be prevented from occurring in the first inorganic encapsulation layer 191 or the second inorganic encapsulation layer 193. Therefore, reliability of the display panel 100 or the display device including the display panel 100 is increased.

In some embodiments, a sensor electrode layer SEN is disposed on the encapsulation layer TFEL and the organic passivation layer OL in the second display area DA2 and the third display area DA3.

For example, as described above, a first touch insulating layer TINS1 is disposed on the encapsulation layer TFEL, a second touch insulating layer TINS2 is disposed on the first touch insulating layer TINS1, and a third touch insulating layer TINS3 is disposed on the second touch insulating layer TINS2.

In some embodiments, the first touch insulating layer TINS1 is disposed over the third display area DA3 and the second display area DA2. The first touch insulating layer TINS1 directly contacts the organic passivation layer OL, and covers the organic passivation layer OL and the second inorganic encapsulation layer 193.

In some embodiments, the second touch insulating layer TINS2 is disposed over the third display area DA3 and the second display area DA2, and directly contacts the first touch insulating layer TINS1.

In some embodiments, the third touch insulating layer TINS3 is also disposed over the third display area DA3 and the second display area DA2.

In some embodiments, the driving electrode RE of FIG. 6 and the sensing electrode TE of FIG. 6 of the sensor electrode layer SEN are not disposed in the second display area DA2 and the third display area DA3. Therefore, the organic passivation layer OL does not overlap the driving electrode RE of FIG. 6 or the sensing electrode TE of FIG. 6 of the sensor electrode layer SEN.

As described above, the touch line TL is disposed in the third display area DA3, and is disposed between the first touch insulating layer TINS1 and the second touch insulating layer TINS2.

In the display device 10 according to an embodiment, since the display area is implemented where a corner portion and a scan driver are disposed, the display area can be enlarged, and a size of a dead space in the display device in which no image is displayed, is reduced. In addition, since cut-out portions are formed in the corner portion, strain on the display area of the corner portion, which has a double curvature, is reduced. Further, since the organic passivation layer is disposed between the second dam of the second display area and the first dam of the third display area, cracks can be prevented from occurring between the second dam and the first dam. As a result, the display area is enlarged, and reliability of the display device is increased.

Figure 14:
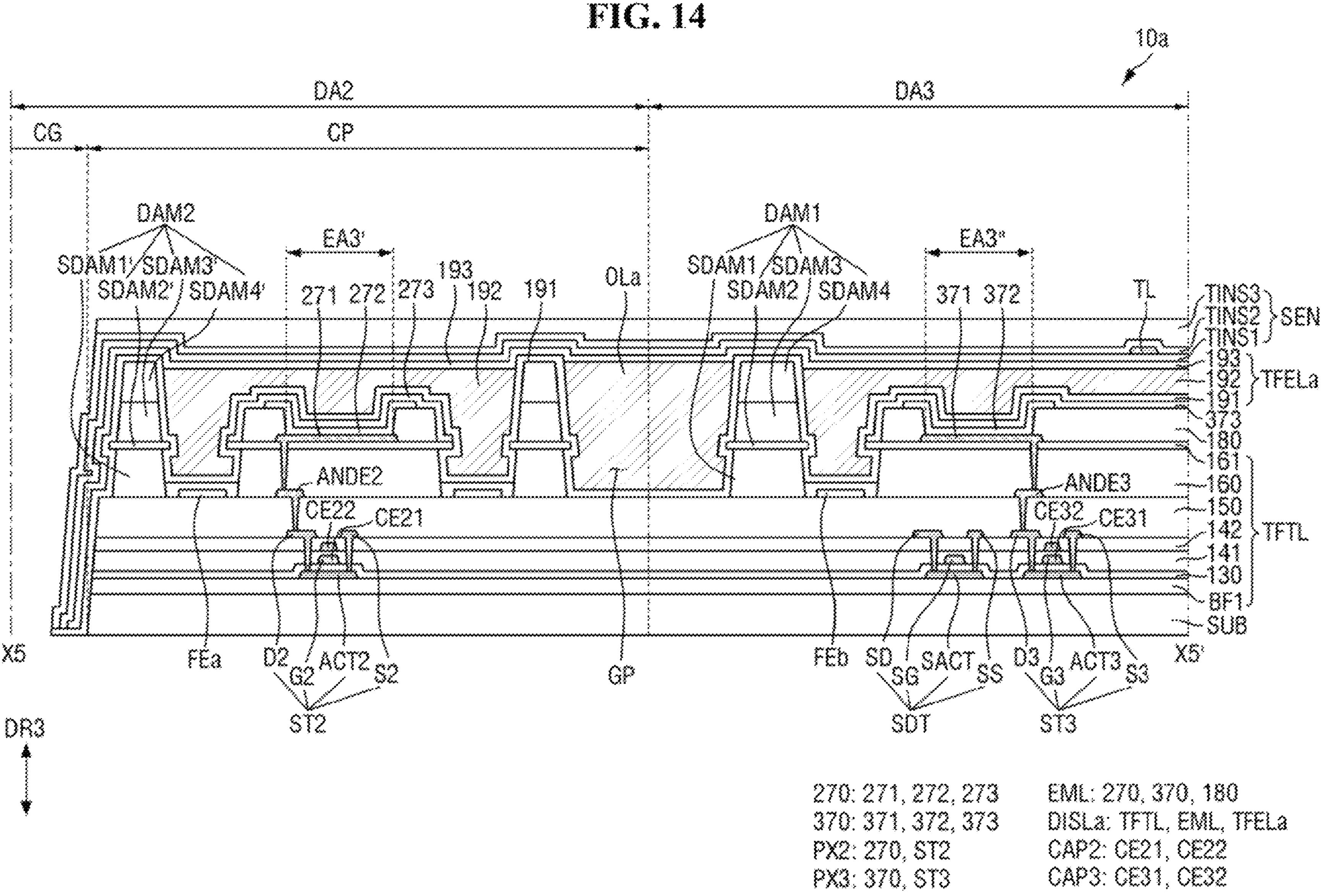
FIG. 14 is a schematic cross-sectional view of a display device according to an embodiment taken along line X3-X3' of FIG. 5.

FIG. 14 is a schematic cross-sectional view of a display device according to an embodiment taken along line X3-X3' of FIG. 5. A cross-sectional structure of a display panel of a display device is shown in FIG. 14.

Referring to FIG. 14, in an embodiment, a display device **10*a* according to an embodiment differs from the display device 10 shown in FIG. 11 in that a display layer DISLa includes an encapsulation layer TFELa, and a separate organic passivation layer is not disposed between the encapsulation layer TFELa and the sensor electrode layer SEN. However, the other elements of the display device 10*a* are substantially the same as those of the display device 10 shown in FIG. 11. Therefore, a repeated description will be omitted, and the following description will be based on the difference from the display device of FIG. 11**.

The encapsulation layer TFELa is disposed on the light emitting element layer EML.

The encapsulation layer TFELa includes a first inorganic encapsulation layer 191, an organic encapsulation layer 192, a second inorganic encapsulation layer 193, and an organic passivation layer OLa.

In embodiments, the organic passivation layer OLa is disposed in the gap space GP between the first dam DAM1 and the second dam DAM2, and is disposed between the first inorganic encapsulation layer 191 and the second inorganic encapsulation layer 193. In embodiments, the organic passivation layer OLa directly contacts the first inorganic encapsulation layer 191 and the second inorganic encapsulation layer 193.

Since the organic passivation layer OLa is disposed between the first inorganic encapsulation layer 191 and the second inorganic encapsulation layer 193 in the gap space GP, the first inorganic encapsulation layer 191 and the second inorganic encapsulation layer 193 are spaced apart from each other in the gap space GP without being in direct contact with each other.

The organic passivation layer OLa is made of an organic insulating material. In embodiments, the organic passivation layer OLa includes the same material as the organic encapsulation layer 192, and formed together with the organic encapsulation layer 192 during a process of forming the organic encapsulation layer 192.

Since the organic passivation layer OLa is disposed in the gap space GP between the first dam DAM1 and the second dam DAM2, cracks can be prevented from occurring in the first inorganic encapsulation layer 191 when the second display area DA2 or the cut-out pattern CP are bent. In addition, since the organic passivation layer OLa is formed of the same material as the organic encapsulation layer 192 during a process of forming the organic encapsulation layer 192, the organic passivation layer can be formed without an additional process.

Figure 15:
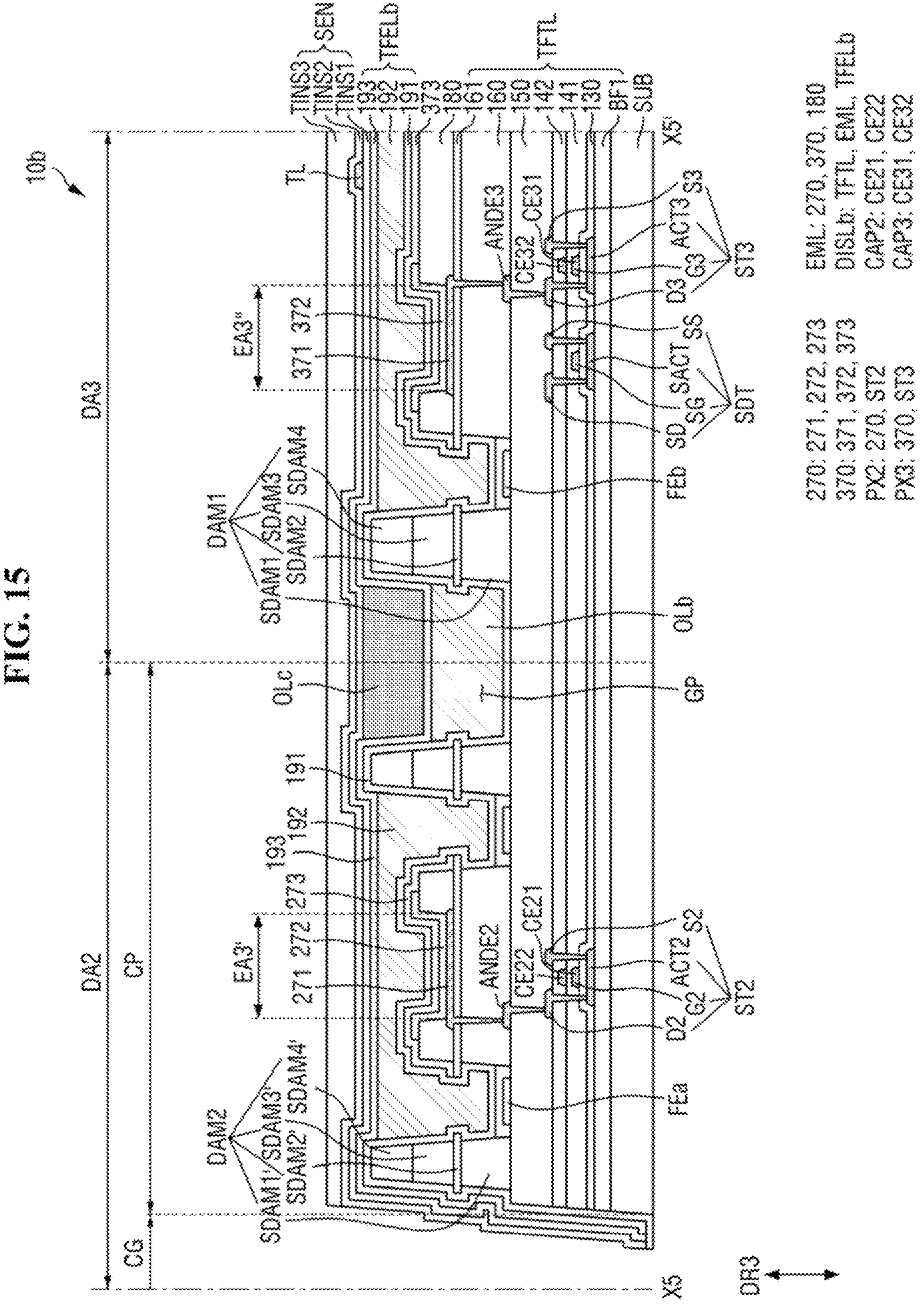
FIG. 15 is a schematic cross-sectional view of a display device according to an embodiment taken along line X3-X3' of FIG. 5.

FIG. 15 is a schematic cross-sectional view of a display device according to an embodiment taken along line X3-X3' of FIG. 5. A cross-sectional structure of a display panel of a display device is shown in FIG. 15.

Referring to FIG. 15, in an embodiment, a display device **10*b* according to an embodiment differs from the display device 10 shown in FIG. 11 in that a display layer DISLa includes an encapsulation layer TFELb. However, the other elements of the display device 10***b* are substantially the same as those of the display device 10 shown in FIG. 11. Therefore, a repeated description will be omitted, and the following description will be based on the difference from the display device of FIG. 11.

The encapsulation layer TFELb includes a first inorganic encapsulation layer 191, an organic encapsulation layer 192, a second inorganic encapsulation layer 193, and a first organic passivation layer OLb.

In embodiments, the first organic passivation layer OLb is disposed in the gap space GP between the first dam DAM1 and the second dam DAM2, and is disposed between the first inorganic encapsulation layer 191 and the second inorganic encapsulation layer 193. In embodiments, the first organic passivation layer OLb directly contacts the first inorganic encapsulation layer 191 and the second inorganic encapsulation layer 193. In embodiments, the organic passivation layer OLb includes the same material as the organic passivation layer Ola.

A second organic passivation layer OLc is further disposed between the second inorganic encapsulation layer 193 and the sensor electrode layer SEN. In embodiments, the second organic passivation layer OLc is disposed between the second inorganic encapsulation layer 193 and the first touch insulating layer TINS1, and directly contacts the second inorganic encapsulation layer 193 and the first touch insulating layer TINS1.

The second organic passivation layer OLc overlaps the first organic passivation layer OLb.

The second organic passivation layer OLc is made of an organic insulating material. The organic insulating material in the second organic passivation layer OLc is substantially the same as that of the organic passivation layer OL described with reference to FIG. 11, and thus its detailed description will be omitted.

Although embodiments of the present disclosure have been disclosed for illustrative purposes, those skilled in the art will appreciate that various modifications, additions and substitutions are possible, without departing from the scope and spirit of embodiments of the disclosure as disclosed in the accompanying claims.

What is claimed is:

1. A display device, comprising:

a substrate that includes a front portion, a first side portion that extends from the front portion along a first direction, a second side portion that extends from the front portion along a second direction that crosses the first direction, and a corner portion disposed between the first side portion and the second side portion and that includes a cut-out pattern;

a first light emitting element disposed on the front portion of the substrate and in a first display area in the front portion;

a second light emitting element disposed on the cut-out pattern of the substrate and in a second display area in the corner portion;

a first dam disposed between the front portion of the substrate and the corner portion of the substrate;

a second dam disposed on the cut-out pattern of the substrate and in the second display area, wherein the second dam surrounds the second light emitting element;

an encapsulation layer disposed on the substrate, wherein the encapsulation layer covers the first light emitting element, the second light emitting element, the first dam, and the second dam; and an organic passivation layer disposed on the encapsulation layer and confined to a gap space between the first dam and the second dam by being surrounded on both sides within the gap by the encapsulation layer.

2. The display device of claim 1, wherein the encapsulation layer includes:

a first inorganic encapsulation layer disposed on the first light emitting element and the second light emitting element;

an organic encapsulation layer disposed on the first inorganic encapsulation layer, wherein the organic encapsulation layer includes a first portion disposed in the first display area and a second portion disposed in the second display area, wherein the first portion and the second portion are separated from each other by the first dam and the second dam; and a second inorganic encapsulation layer disposed on the organic encapsulation layer, wherein the organic passivation layer is disposed on the second inorganic encapsulation layer in the gap space.

3. The display device of claim 2, wherein the second inorganic encapsulation layer directly contacts the first inorganic encapsulation layer and the organic passivation layer in the gap space.

4. The display device of claim 2, wherein the cut-out pattern includes a plurality of cut-out patterns, wherein a cutout portion that penetrates the substrate is formed in the corner portion, and wherein the cut-out portion is formed between two adjacent cut-out patterns of the plurality of cut-out patterns.

5. The display device of claim 4, wherein the first inorganic encapsulation layer surrounds a side of the substrate in the cut-out portion, and wherein the second inorganic encapsulation layer directly contacts the first inorganic encapsulation layer in the cut-out portion.

6. The display device of claim 1, further comprising a sensor electrode layer disposed on the encapsulation layer, wherein the sensor electrode layer includes a sensing electrode, wherein the organic passivation layer is disposed between the sensor electrode layer and the encapsulation layer.

7. The display device of claim 6, wherein the sensor electrode layer further includes a first touch insulating layer disposed on the encapsulation layer and a second touch insulating layer disposed on the first touch insulating layer, wherein the sensing electrode is disposed on the second touch insulating layer, and wherein the first touch insulating layer directly contacts the organic passivation layer only in the gap space.

8. The display device of claim 6, wherein the organic passivation layer does not overlap the sensing electrode.

9. The display device of claim 1, further comprising a third light emitting element disposed on the substrate, wherein the third light emitting element is disposed in a third display area in the corner portion and interposed between the first display area and the second display area, wherein the first dam is disposed between the third light emitting element and the second dam, and wherein the organic passivation layer is disposed in the second display area and the third display area.

10. The display device of claim 9, further comprising a scan driving transistor and a thin film transistor disposed on the substrate and in the third display area, wherein the third light emitting element is electrically connected to the thin film transistor, and wherein the third light emitting element overlaps the scan driving transistor.

11. The display device of claim 10, further comprising a sensor electrode layer disposed on the encapsulation layer, wherein the sensor electrode layer contacts the organic passivation layer, wherein the sensor electrode layer includes a sensing electrode disposed in the first display area and a touch line disposed in the third display area.

12. The display device of claim 1, further comprising:

a thin film transistor disposed on the substrate and in the first display area;

a first insulating layer disposed on the thin film transistor;

a second insulating layer disposed on the first insulating layer;

a bank disposed on the second insulating layer; and a spacer disposed on the bank, wherein a pixel electrode of the first light emitting element is disposed between the second insulating layer and the bank, wherein the pixel electrode of the first light emitting element is electrically connected to the thin film transistor, and wherein each of the first dam and the second dam includes a sub dam made of a same material as that of one of the second insulating layer, the bank or the spacer.

13. A display device, comprising:

a substrate that includes a front portion, a first side portion that extends from the front portion along a first direction, a second side portion that extends from the front portion along a second direction that crosses the first direction, and a corner portion disposed between the first side portion and the second side portion and that includes a cut-out pattern;

a first light emitting element disposed on the front portion of the substrate and in a first display area in the front portion;

a second light emitting element disposed on the cut-out pattern of the substrate and in a second display area in the corner portion;

a first dam disposed between the front portion of the substrate and the corner portion of the substrate;

a second dam disposed on the cut-out pattern of the substrate and in the second display area, wherein the second dam surrounds the second light emitting element;

a first inorganic encapsulation layer disposed on the substrate, wherein the first inorganic encapsulation layer covers the first light emitting element, the second light emitting element, the first dam and the second dam;

a second inorganic encapsulation layer disposed on the first inorganic encapsulation layer; and a first organic passivation layer confined to a gap space between the first dam and the second dam, wherein the first inorganic encapsulation layer and the second inorganic encapsulation layer are disposed on side surfaces and a bottom surface of the gap space.

14. The display device of claim 13, wherein the first organic passivation layer directly contacts the first inorganic encapsulation layer and the second inorganic encapsulation layer in the gap space.

15. The display device of claim 13, further comprising an organic encapsulation layer disposed between the first inorganic encapsulation layer and the second inorganic encapsulation layer, wherein the first organic passivation layer and the organic encapsulation layer are spaced apart from each other.

16. The display device of claim 15, wherein the first organic passivation layer and the organic encapsulation layer are made of a same organic insulating material.

17. The display device of claim 15, wherein the organic encapsulation layer includes a first portion disposed in the first display area and that overlaps the first light emitting element and a second portion disposed in the second display area and that overlaps the second light emitting element, wherein the first portion, the second portion and the first organic passivation layer are spaced apart from one another.

18. The display device of claim 13, further comprising a sensor electrode layer disposed on the second inorganic encapsulation layer and that includes a sensing electrode, wherein the second inorganic encapsulation layer directly contacts the sensor electrode layer.

19. The display device of claim 13, further comprising:

a sensor electrode layer disposed on the second inorganic encapsulation layer and that includes a sensing electrode; and a second organic passivation layer disposed between the sensor electrode layer and the second inorganic encapsulation layer and in the gap space.

20. The display device of claim 19, wherein the second organic passivation layer contacts the sensor electrode layer and the second inorganic encapsulation layer, and the first organic passivation layer and the second organic passivation layer overlap each other.

21. An electronic device, comprising:

a display device, wherein the display device comprises:

a substrate that includes a front portion, a first side portion that extends from the front portion along a first direction, a second side portion that extends from the front portion along a second direction that crosses the first direction, and a corner portion disposed between the first side portion and the second side portion and that includes a cut-out pattern, where the substrate further includes a first display area in the front portion, a second display area in the cutout pattern, and a third display area disposed in the corner portion and interposed between the first display area and the second display area;

a first light emitting element disposed in the first display area;

a second light emitting element disposed in the second display area;

a third light emitting element disposed in the third display area;

a first dam disposed between the front portion of the substrate and the corner portion of the substrate;

a second dam disposed on the cut-out pattern of the substrate and in the second display area, wherein the second dam surrounds the second light emitting element; and a first organic passivation layer disposed only in a gap space between the first dam and the second dam.

22. The electronic device of claim 21, further comprising:

an encapsulation layer disposed on the substrate, wherein the encapsulation layer covers the first light emitting element, the second light emitting element, the first dam, and the second dam, wherein the encapsulation layer includes:

a first inorganic encapsulation layer disposed on the first light emitting element and the second light emitting element;

an organic encapsulation layer disposed on the first inorganic encapsulation layer, wherein the organic encapsulation layer includes a first portion disposed in the first display area and a second portion disposed in the second display area, wherein the first portion and the second portion are separated from each other by the first dam and the second dam; and a second inorganic encapsulation layer disposed on the organic encapsulation layer, wherein the first organic passivation layer is disposed under the second inorganic encapsulation layer in the gap space.

23. The electronic device of claim 21, further comprising:

a first inorganic encapsulation layer disposed on the substrate, wherein the first inorganic encapsulation layer covers the first light emitting element, the second light emitting element, the first dam and the second dam; and a second inorganic encapsulation layer disposed on the first inorganic encapsulation layer, wherein the first organic passivation layer is disposed between the first inorganic encapsulation layer and the second inorganic encapsulation layer in the gap space between the first dam and the second dam.

24. The electronic device of claim 23, further comprising:

a sensor electrode layer disposed on the second inorganic encapsulation layer and that includes a sensing electrode; and a second organic passivation layer disposed between the sensor electrode layer and the second inorganic encapsulation layer and in the gap space.

* * * * *